United States Patent
Yamaguchi et al.

(10) Patent No.: US 9,710,088 B2
(45) Date of Patent: Jul. 18, 2017

(54) CONDUCTIVE FILM, DISPLAY DEVICE PROVIDED WITH SAME, AND EVALUATION AND DETERMINATION METHOD FOR CONDUCTIVE FILM WIRING PATTERN

(71) Applicant: FUJIFILM Corporation, Minato-ku, Tokyo (JP)

(72) Inventors: Yoshitaka Yamaguchi, Ashigara-kami-gun (JP); Kazuchika Iwami, Ashiara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 34 days.

(21) Appl. No.: 14/876,342

(22) Filed: Oct. 6, 2015

(65) Prior Publication Data

US 2016/0092012 A1    Mar. 31, 2016

Related U.S. Application Data

(63) Continuation of application No. PCT/JP2014/059210, filed on Mar. 28, 2014.

(30) Foreign Application Priority Data

Apr. 10, 2013  (JP) .................................. 2013-082233

(51) Int. Cl.
  *G06F 3/041* (2006.01)
  *G06F 1/16* (2006.01)
  (Continued)

(52) U.S. Cl.
  CPC ........... *G06F 3/0412* (2013.01); *G02B 27/60* (2013.01); *G02F 1/13338* (2013.01); *G06F 1/16* (2013.01);
  (Continued)

(58) Field of Classification Search
  CPC .... G02F 2001/133334; G02F 1/13338; H05K 1/0228; H05K 1/0274; H05K 1/0296;
  (Continued)

(56) References Cited

U.S. PATENT DOCUMENTS

2013/0028503 A1    1/2013  Wakui et al.
2013/0294037 A1    11/2013 Kuriki et al.

FOREIGN PATENT DOCUMENTS

JP          11340679 A     12/1999
JP        2009-117683 A     5/2009
  (Continued)

OTHER PUBLICATIONS

International Preliminary Report on Patentability and Written Opinion, dated Oct. 22, 2015, issued in corresponding International Application No. PCT/JP2014/059210, 6 pages in English.
(Continued)

*Primary Examiner* — Vijay Shankar
*Assistant Examiner* — Abhishek Sarma
(74) *Attorney, Agent, or Firm* — Sughrue Mion PLLC

(57) ABSTRACT

For the frequencies and intensities of moire obtained by applying the human visual response characteristics to the frequency information and intensity information of moire which are respectively calculated from the peak frequencies and peak intensities of a two-dimensional Fourier spectrum of the transmittance image data of a wiring pattern and the peak frequencies and peak intensities of a two-dimensional Fourier spectrum of the transmittance image data of a pixel array pattern, the sum of the intensities of moire with frequencies which are within a predetermined frequency range that is determined according to the visual response characteristics is equal to or less than a predetermined value.

17 Claims, 14 Drawing Sheets

(51) Int. Cl.
    *H05K 1/02*       (2006.01)
    *G02F 1/1333*     (2006.01)
    *G02B 27/60*      (2006.01)

(52) U.S. Cl.
    CPC ......... *H05K 1/0228* (2013.01); *H05K 1/0274* (2013.01); *H05K 1/0296* (2013.01); *G02F 2001/133334* (2013.01); *G06F 2203/04112* (2013.01)

(58) Field of Classification Search
    CPC ............ G06F 1/16; G06F 2203/04112; G06F 3/0412; G02B 27/60
    See application file for complete search history.

(56) References Cited

FOREIGN PATENT DOCUMENTS

| | | |
|---|---|---|
| JP | 2011-216379 A | 10/2011 |
| JP | 2012-163933 A | 8/2012 |
| JP | 2012-163951 A | 8/2012 |
| JP | 2012-164648 A | 8/2012 |
| JP | 2013025626 A | 2/2013 |

OTHER PUBLICATIONS

Communication dated Jul. 27, 2016, from the European Patent Office in counterpart European Application No. 14782839.6.
International Search Report for PCT/JP2014/059210 dated Jul. 1, 2014, 6 pages in Japanese and Eng.

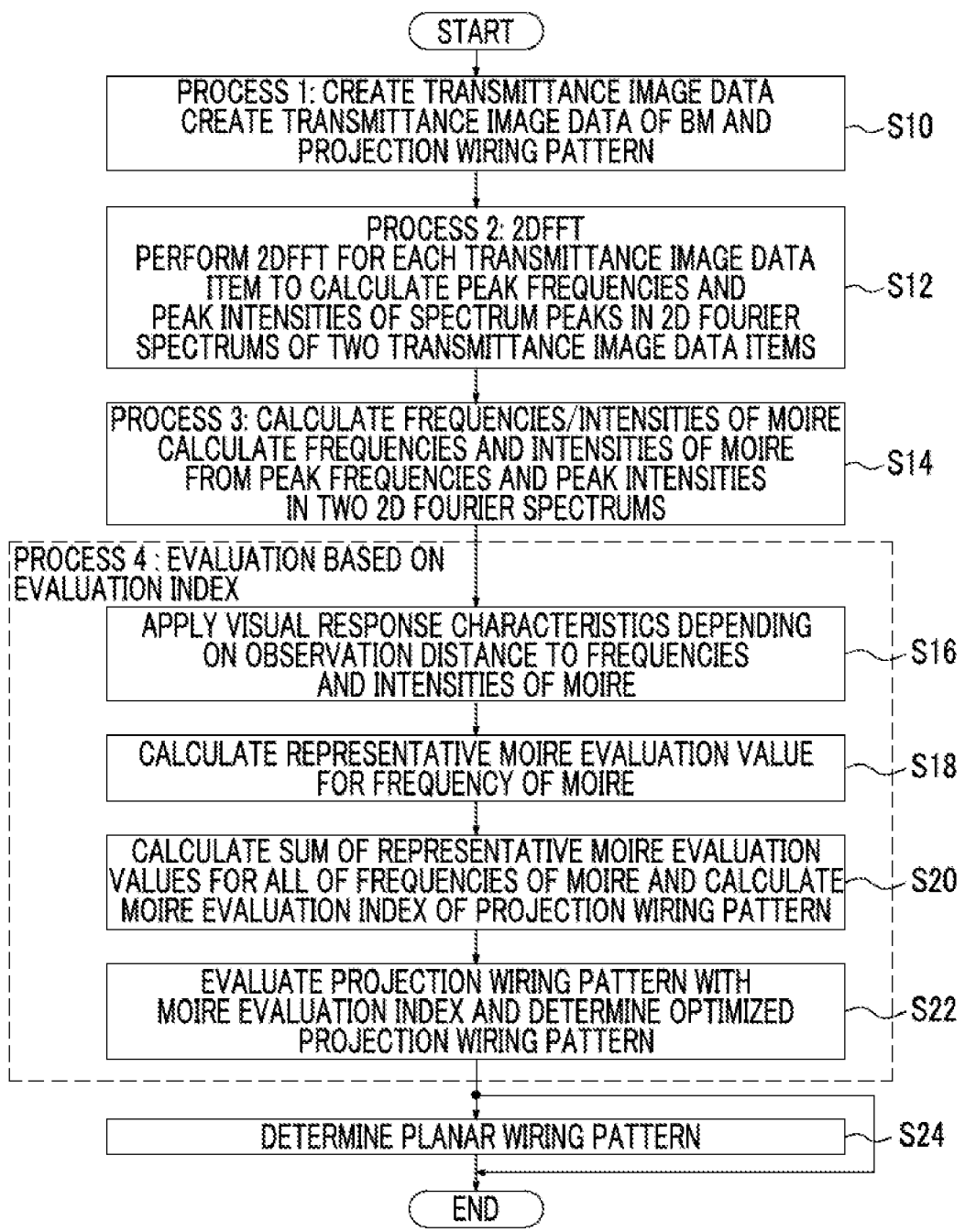

FIG. 12A
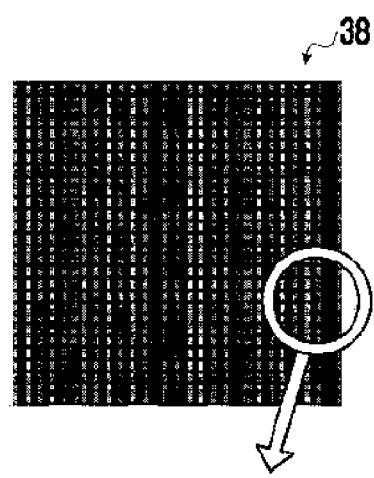
FIG. 12B
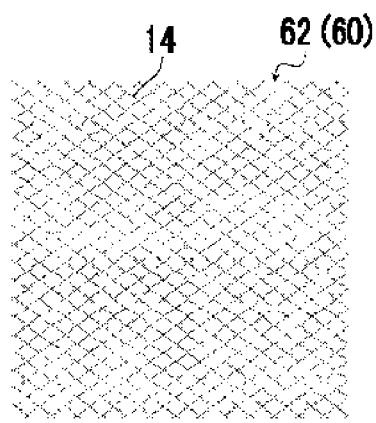
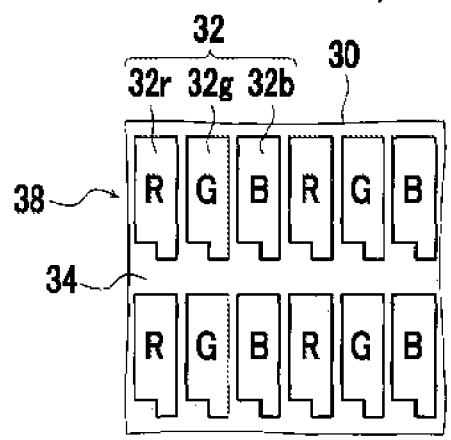
FIG. 12C
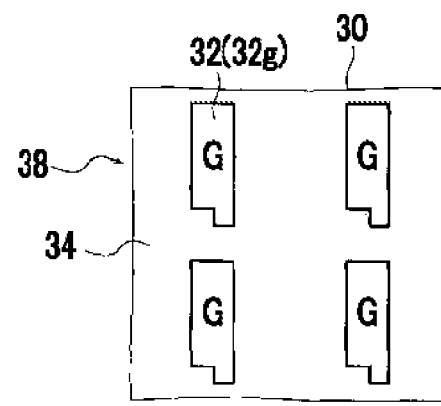
FIG. 12D
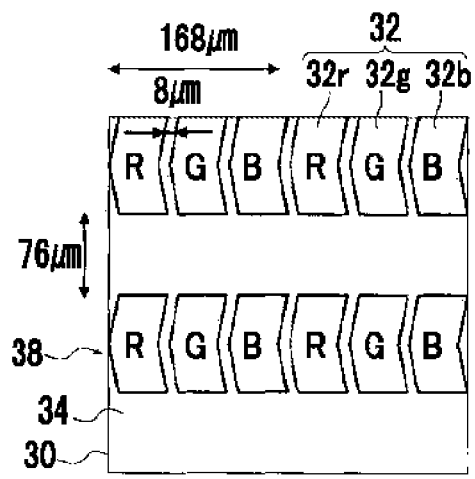
FIG. 13A
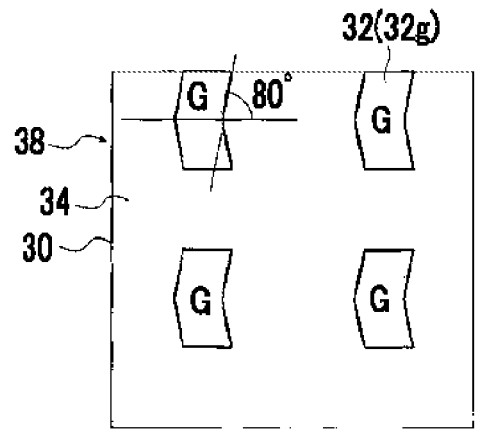
FIG. 13B FIG. 14A
FIG. 14B
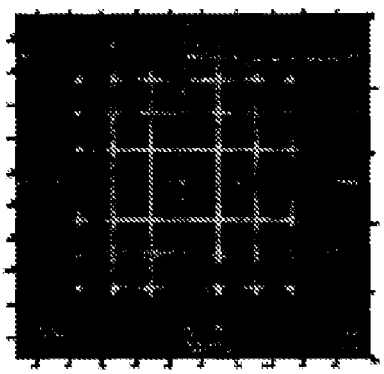
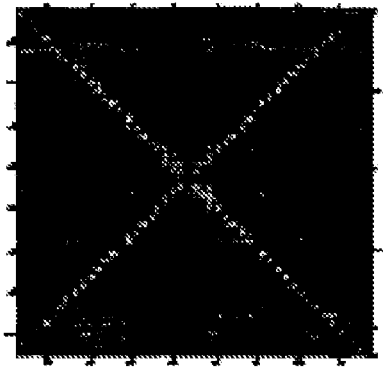
FIG. 15
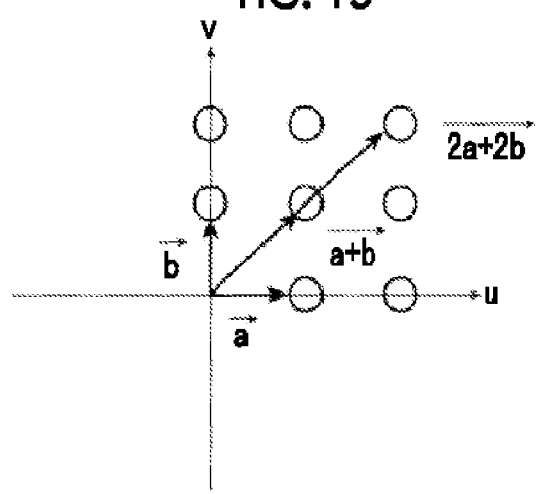
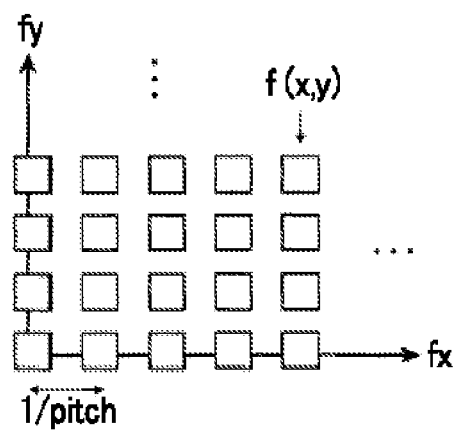
FIG. 16A
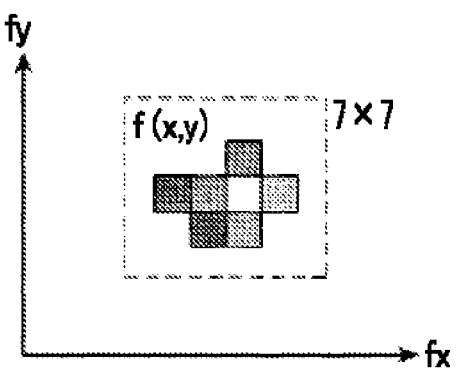
FIG. 16B

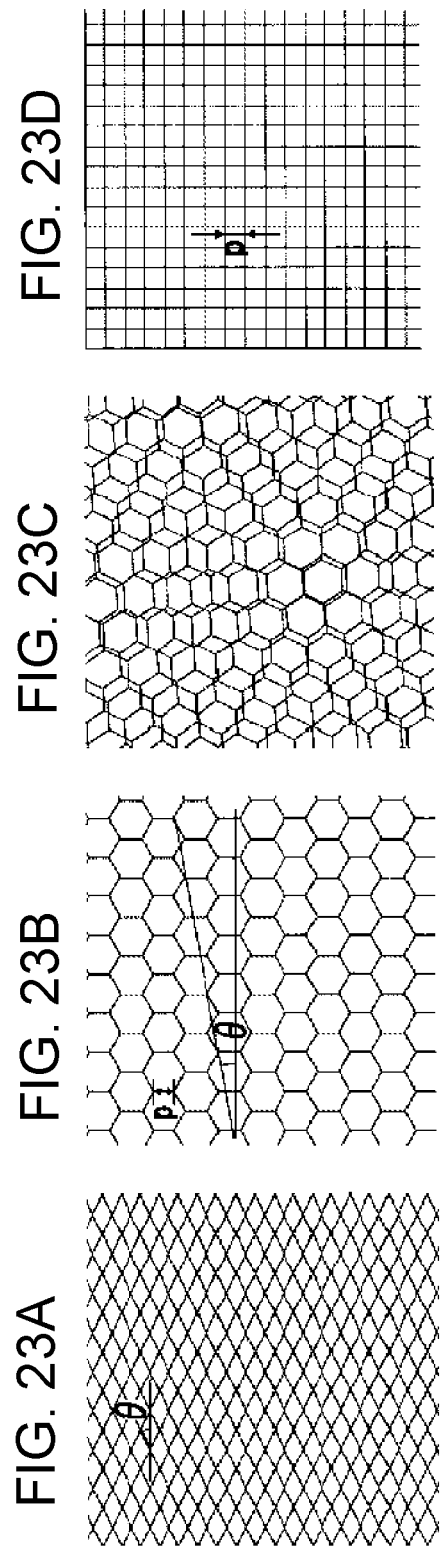

FIG. 24A
FIG. 24B
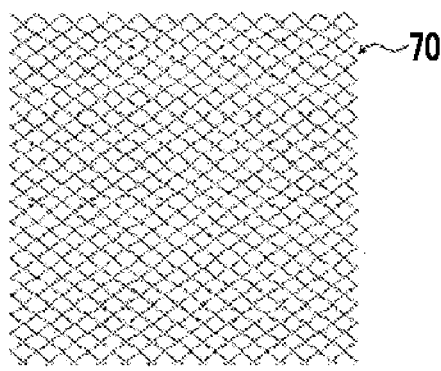
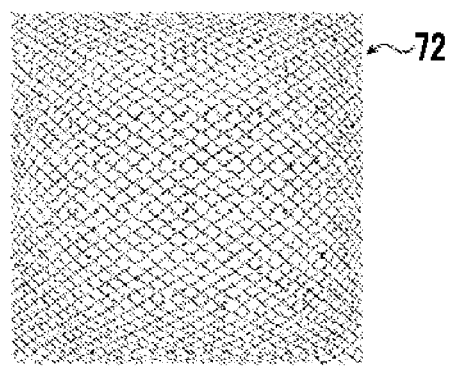
FIG. 25
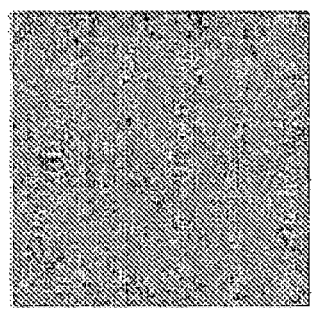

CONDUCTIVE FILM, DISPLAY DEVICE PROVIDED WITH SAME, AND EVALUATION AND DETERMINATION METHOD FOR CONDUCTIVE FILM WIRING PATTERN

CROSS REFERENCE TO RELATED APPLICATIONS

This application is a continuation of PCT International Application No. PCT/JP2014/059210 filed on Mar. 28, 2014, which claims priority under 35 U.S.C. §119(a) to Japanese Patent Application No. 2013-082233 filed on Apr. 10, 2013. Each of the above applications is hereby expressly incorporated by reference, in its entirety, into the present application.

BACKGROUND OF THE INVENTION

The present invention relates to a conductive film that is used in a three-dimensional shape, a display device including the conductive film, and a method for evaluating and determining a wiring pattern of the conductive film.

Examples of a conductive film that is provided on a display unit of a display device (hereinafter, also referred to as a "display") of, for example, a mobile phone include a conductive film for shielding electromagnetic waves and a conductive film for touch panels (for example, see JP2009-117683A, JP2011-216379A, JP2012-163933A, JP2012-163951A, and JP2012-164648A).

JP2009-117683A filed by the inventors discloses a technique which automatically select a second pattern that is generated from second pattern data in which the relative distance between the spectrum peaks of two-dimensional Fourier spectrums (2DFFT Sp) in the pattern data of a first pattern, such as a pixel array pattern (for example, a black matrix (hereinafter, also referred to as BM) pattern) of a display and the pattern data of the second pattern, such as an electromagnetic wave shielding pattern, is greater than a predetermined spatial frequency, for example, 8 cm$^{-1}$.

Therefore, according to the technique disclosed in JP2009-117683A, it is possible to automatically select an electromagnetic wave shielding pattern which can prevent the occurrence of moire and avoid an increase in surface resistivity or the deterioration of transparency.

JP2011-216379A filed by the inventors discloses a transparent conductive film which has a mesh pattern including a plurality of polygonal meshes. In the transparent conductive film, the mesh pattern is formed such that, in the centroid spectrum of each mesh, average intensity in a frequency band higher than a predetermined spatial frequency, for example, a spatial frequency at which the human visual response characteristics are 5% of the maximum response is higher than average intensity in a frequency band lower than the predetermined spatial frequency.

Therefore, according to the technique disclosed in JP2011-216379A, it is possible to provide a transparent conductive film which can reduce noise granular feeling caused by the pattern, can significantly improve the visibility of the object to be observed, and has a stable conduction performance even after being cut.

JP2012-163933A filed by the inventors discloses a conductive pattern having a rhombic-shaped mesh formed by thin metal wires. In the conductive pattern, the ratio of the lengths of two diagonal lines of the rhombus of an opening in each mesh is limited to a predetermined range. JP2012-163951A discloses a mesh pattern formed by thin metal wires. In the mesh pattern, the inclination angle of the thin metal wire with respect to the direction in which the pixels of a display device are arranged is limited to a predetermined range. JP2012-164648A discloses a rhombic-shaped mesh pattern formed by thin metal wires. In the mesh pattern, the vertex angle of the rhombus of an opening in each mesh is limited to a predetermined range. Therefore, even when the pattern is attached to a display panel, moire is less likely to occur and it is possible to produce products with high yield.

SUMMARY OF THE INVENTION

However, the conductive films disclosed in JP2009-117683A, JP2011-216379A, JP2012-163933A, JP2012-163951A, and JP2012-164648A all have a planar shape. When the conductive film is superimposed on a flat display surface of a display, it is possible to reduce moire caused by the interference between the wiring pattern of the conductive film and a BM pattern of the display and to improve the visibility of moire. However, when the planar conductive film with high visibility of moire is used in a solid shape, for example, a three-dimensional shape in which both corresponding sides are curved and a central portion therebetween is flat, the spatial frequency of a wiring pattern 70 of a planar conductive film with high visibility of moire illustrated in FIG. 24A is changed due to a change in shape from a planar shape (two-dimensional shape) to a three-dimensional shape and the wiring pattern 70 becomes a projection wiring pattern 72 when it is observed from the point of view in front of the display surface of the display, as illustrated in FIG. 24B. Therefore, as illustrated in FIG. 25, moire occurs in a curved portion whose shape has been changed due to the interference between the projection wiring pattern 72 and the BM pattern.

In JP2009-117683A, the frequency of moire is controlled on the basis of only the frequency information of the BM pattern of the display and the wiring pattern of the conductive film. Therefore, moire is seen due to the intensity since the visual perception of moire by the human is affected by not only the frequency but also intensity and the visibility of moire is not sufficiently improved.

JP2011-216379A merely aims at reducing the graininess of the mesh pattern of the transparent conductive film which is visually recognized by the human, considering human visual response characteristics to the centroid spectrum of each mesh in the mesh pattern of the transparent conductive film and does not disclose a technique for improving the visibility of moire.

The invention has been made in order to solve the above-mentioned problems of the related art and an object of the invention is to provide a conductive film that can suppress the occurrence of moire and/or graininess and significantly improve the visibility of moire and/or graininess when the conductive film is used in a three-dimensional shape, a display device including the conductive film, and a method for evaluating and determining a wiring pattern of the conductive film.

In particular, an object of the invention is to provide a conductive film that can suppress the occurrence of moire causing significant deterioration of image quality when the conductive film is superimposed on a black matrix of a display unit of a display device and is seen and significantly improve display visibility on a touch panel in a case in which a transparent conductive film having patterned wires is arranged in a three-dimensional shape on a display surface of the display unit of the display device and is used as a touch panel electrode, a display device including the conductive film, a method for evaluating and determining a wiring pattern of the conductive film.

In order to achieve the object, according to a first aspect of the invention, there is provided a conductive film which is provided on a display unit of a display device and is used with at least a portion being curved with a predetermined curvature. The conductive film includes a transparent base and a conductive portion that is formed on at least one surface of the transparent base and includes a plurality of thin metal wires. The conductive portion has a wiring pattern which is formed in a mesh shape by the plurality of thin metal wires and in which a plurality of openings are arranged. The wiring pattern is superimposed on a pixel array pattern of the display unit. An index for evaluating moire which occurs due to interference between the pixel array pattern and a projection wiring pattern obtained by projecting the wiring pattern of the conductive film, which is expanded in a planar shape, in a three-dimensional shape in which the at least portion is curved with the predetermined curvature in a usage state of the conductive film, as viewed from at least one point of view, is within a predetermined range in which the moire is not seen.

In order to achieve the object, according to a second aspect of the invention, there is provided a conductive film which is provided on a display unit of a display device and is used with at least a portion being curved with a predetermined curvature. The conductive film includes a transparent base and a conductive portion that is formed on at least one surface of the transparent base and includes a plurality of thin metal wires. The conductive portion has a wiring pattern which is formed in a mesh shape by the plurality of thin metal wires and in which a plurality of openings are arranged. A projection wiring pattern obtained by projecting the wiring pattern of the conductive film, which is expanded in a planar shape, in a three-dimensional shape in which the at least portion is curved with the predetermined curvature in a usage state of the conductive film has uniform mesh density, as viewed from at least one point of view.

In order to achieve the object, according to a third aspect of the invention, there is provided a display device including a display unit and the conductive film according to the first or second aspect that is provided on a display surface of the display unit, with at least a portion being curved with a predetermined curvature.

In order to achieve the object, according to a fourth aspect of the invention, there is provided a method for evaluating and determining a wiring pattern of a planar conductive film that is provided on a display unit of a display device, has the wiring pattern which is formed in a mesh shape by a plurality of thin metal wires and in which a plurality of openings are arranged, and is used with at least a portion being curved with a predetermined curvature. The method includes: projecting the wiring pattern of the planar conductive film to a usage state of the conductive film in which the at least portion is curved with the predetermined curvature to obtain a projection wiring pattern; superimposing the obtained projection wiring pattern on a pixel array pattern of the display unit; calculating an index for evaluating moire which occurs due to interference between the projection wiring pattern and the pixel array pattern, as viewed from at least one point of view; comparing the calculated moire evaluation index with a predetermined range in which the moire is not seen and evaluating and calculating a projection wiring pattern in which the moire evaluation index is within the predetermined range; and expanding the calculated projection wiring pattern in a planar shape to determine the wiring pattern of the planar conductive film.

In the first, second, third, or fourth aspect, preferably, the conductive film has a three-dimensional shape having curved portions which are curved with the predetermined curvature and are provided on both of corresponding sides of a display surface of the display unit and a planar portion which is provided between the two curved portions and is parallel to the display surface of the display unit in the usage state, and the one point of view is in front of the conductive film in a direction perpendicular to the planar portion parallel to the display surface of the display unit.

Preferably, the conductive film is a planar conductive film having a planar wiring pattern obtained by expanding the projection wiring pattern, which is projected in the three-dimensional shape in the usage state, in a planar shape.

Preferably, the moire evaluation index is calculated from a moire evaluation value obtained by applying, depending on an observation distance, human visual response characteristics to intensities of moire at each frequency of the moire equal to or lower than the highest frequency of the moire, which is defined according to a display resolution of the display unit, among the frequencies and intensities of the moire which are calculated from peak frequencies and peak intensities of a plurality of spectrum peaks in a two-dimensional Fourier spectrum of transmittance image data of the projection wiring pattern and peak frequencies and peak intensities of a plurality of spectrum peaks in a two-dimensional Fourier spectrum of transmittance image data of the pixel array pattern, as viewed from at least one point of view.

Preferably, the predetermined range is equal to or less than a predetermined value.

Preferably, the common logarithm of the predetermined value is −1.75 and the common logarithm of the moire evaluation index is equal to or less than −1.75.

Preferably, the moire evaluation index is calculated by weighting through convolution between the frequencies and intensities of the moire and a visual transfer function which indicates the visual response characteristics and corresponds to the observation distance.

In the fourth aspect, preferably, the moire evaluation index is calculated from a plurality of moire evaluation values. Preferably, the plurality of moire evaluation values are obtained by: acquiring transmittance image data of the projection wiring pattern and transmittance image data of a pixel array pattern of the display unit on which the projection wiring pattern is superimposed, as viewed from at least one point of view; performing two-dimensional Fourier transform for the transmittance image data of the projection wiring pattern and the transmittance image data of the pixel array pattern to calculate peak frequencies and peak intensities of a plurality of spectrum peaks in a two-dimensional Fourier spectrum of the transmittance image data of the projection wiring pattern and peak frequencies and peak intensities of a plurality of spectrum peaks in a two-dimensional Fourier spectrum of the transmittance image data of the pixel array pattern; calculating frequencies and intensities of moire from the calculated peak frequencies and peak intensities of the projection wiring pattern and the calculated peak frequencies and peak intensities of the pixel array pattern; selecting moire having frequencies equal to or lower than the highest frequency of the moire which is defined according to a display resolution of the display unit from the calculated frequencies and intensities of the moire; and applying human visual response characteristics to the intensities of the moire at each frequency of the selected moire, depending on an observation distance. Preferably, the common logarithm of the predetermined range is −1.75.

In the first, third, or fourth aspect, preferably, the projection wiring pattern has uniform mesh density.

In the first, second, third, or fourth aspect, preferably, the projection wiring pattern is a rhombus pattern or a random pattern.

Preferably, when the average of the opening areas of the openings in the projection wiring pattern is 1.0, a variation in the opening area in the projection wiring pattern is in a range of 0.8 to 1.2.

Preferably, a difference between the peak frequency of the projection wiring pattern and the peak frequency of the pixel array pattern is calculated as the frequency of the moire, and the product of the peak intensities of the projection wiring pattern and the peak intensities of the pixel array pattern is calculated as the intensity of the moire.

In the first, second, third, or fourth aspect, preferably, the common logarithm of the moire evaluation index is −1.89.

Preferably, the highest frequency of the moire is 1000/(2p) when the display pitch of the display unit is p (μm).

Preferably, the visual transfer function is a contrast sensitivity function S(u) represented by the following Expression (1):

$$S(u) = \frac{5200e^{-0.0016u^2(1+100/L)^{0.08}}}{\sqrt{\left(1 + \frac{144}{X_o^2} + 0.64u^2\right)\left(\frac{63}{L^{0.83}} + \frac{1}{1 - e^{-0.02u^2}}\right)}} \quad \text{Expression (1)}$$

(where u is a spatial frequency (cycle/deg), L is brightness (cd/mm$^2$), $X_O$ is the viewing angle (deg) of the display surface of the display unit at the observation distance, and $X_O^2$ is the solid angle (sr) of the display surface at the observation distance).

Preferably, the moire evaluation index is calculated using the worst evaluation value which is selected for one frequency of moire from a plurality of moire evaluation values that are weighted by a coefficient corresponding to the observation distance.

Preferably, the moire evaluation index is the sum of the worst evaluation values for all of the frequencies of moire, each of which is selected for one frequency of moire.

Preferably, moire which is selected in order to apply the visual response characteristics has an intensity of −4 or more and a frequency equal to or lower than the highest frequency.

Preferably, the peak intensity is the sum of the intensities of a plurality of pixels in the vicinity of a peak position.

Preferably, the peak intensity is the sum of the top five intensities among the intensities of 7×7 pixels in the vicinity of the peak position.

Preferably, the peak intensity is normalized with the transmittance image data of the projection wiring pattern and the pixel array pattern.

Preferably, the pixel array pattern is a black matrix pattern.

As described above, according to the invention, when the conductive film is used in a three-dimensional shape, it is possible to suppress the occurrence of moire and/or graininess and to significantly improve the visibility of moire and/or graininess.

That is, according to a preferred embodiment of the invention, the frequency and intensity of moire are calculated from peak frequency and intensity which are obtained by frequency analysis for the pixel array pattern of the display device and the projection wiring pattern obtained by projecting the planar wiring pattern of the conductive film in a three-dimensional shape in the usage state and the values of the calculated intensity and frequency of moire are limited such that visibility is improved. Therefore, it is possible to prevent the deterioration of image quality due to the occurrence of moire and to obtain high visibility.

In particular, according to the invention, the resolution of a display device, such as, a display, is considered when the moire evaluation value at which moire is not seen is calculated. It is possible to generally improve the visibility of moire for display devices with different resolutions. In addition, according to the invention, since the evaluation function which depends on the observation distance is provided, it is possible to evaluate the visibility of moire with a high-accuracy evaluation index, to rank moire, and to significantly improve visibility, regardless of the observation distance.

That is, in the invention, the frequency and intensity of moire are calculated by frequency analysis for the pixel array pattern of the display device and the wiring pattern of the conductive film and the values of the calculated intensity and frequency of moire are limited, considering the resolution of the display device and the observation distance, such that visibility is improved. Therefore, it is possible to prevent the deterioration of image quality due to the occurrence of moire, regardless of the resolution of the display device and the observation distance, and to obtain high visibility.

In the invention, particularly, in a case in which the transparent conductive film having patterned wires is arranged in a three-dimensional shape on a display surface of a display unit of a display device of, for example, a mobile phone and is used as a touch panel electrode, it is possible to prevent the occurrence of moire causing significant deterioration of image quality when the conductive film is superimposed on the black matrix of the display unit of the display device and is then seen. As a result, it is possible to significantly improve the display visibility of the touch panel.

BRIEF DESCRIPTION OF THE DRAWINGS

FIG. 11 is a flowchart illustrating an example of a method for evaluating and determining the projection wiring pattern of the conductive film according to the invention.

FIG. 12A is a diagram schematically illustrating an example of a pixel array pattern of a display unit to which the conductive film according to the invention is applied, FIG. 12B is a diagram schematically illustrating an example of the projection wiring pattern of the conductive film which is superimposed on the pixel array pattern illustrated in FIG. 12A, FIG. 12C is a partially enlarged view illustrating the pixel array pattern illustrated in FIG. 12A, and FIG. 12D is a diagram schematically illustrating a pixel array pattern when only a G-channel sub-pixel is used in FIG. 12C.

FIG. 13A is a partially enlarged view schematically illustrating another example of the pixel array pattern of the display unit to which the conductive film according to the invention is applied and FIG. 13B is a diagram schematically illustrating a pixel array pattern when only a G-channel sub-pixel is used in FIG. 13A.

FIGS. 14A and 14B are diagrams illustrating the intensity characteristics of two-dimensional Fourier spectrums of transmittance image data of the pixel array pattern illustrated in FIG. 12A and the projection wiring pattern illustrated in FIG. 12B, respectively.

FIG. 15 is a graph illustrating frequency peak positions in the pixel array pattern of the display unit illustrated in FIG. 12A.

FIG. 16A is a graph illustrating frequency peak positions in an input pattern image and FIG. 16B is a graph illustrating the calculation of peak intensity at the frequency peak position.

FIGS. 23A, 23B, 23C, and 23D are diagrams schematically illustrating examples of the projection wiring pattern of the conductive film according to the invention.

FIGS. 24A and 24B are plan views schematically illustrating a planar wiring pattern of the conductive film in a planar state which is optimized in the planar state and a projection wiring pattern of the conductive film which is projected in a three-dimensional shape in a used state.

FIG. 25 is a diagram schematically illustrating moire which is seen from the conductive film having the projection wiring pattern with a three-dimensional shape in the used state illustrated in FIG. 24B.

DETAILED DESCRIPTION OF THE INVENTION

Hereinafter, a conductive film and a method for evaluating and determining a wiring pattern of the conductive film according to the invention will be described in detail with reference to preferred embodiments illustrated in the accompanying drawings.

In the following description, a conductive film for a touch panel which is used in a three-dimensional shape is given as a representative example of the conductive film according to the invention. However, the invention is not limited thereto. Any conductive film may be used as long as it is provided in a three-dimensional shape on a display unit of a display device, such as a liquid crystal display (LCD), a plasma display panel (PDP), an organic electroluminescence display (OLED), or an inorganic EL display, in a usage state. The conductive film according to the invention may be, for example, a conductive film for shielding electromagnetic waves.

Figure 1A:
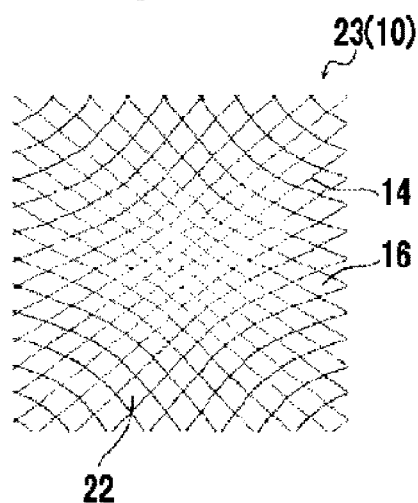
FIGS. 1A and 1B are diagrams schematically illustrating an example of a planar wiring pattern of a conductive film according to a first embodiment of the invention in a planar state and a projection wiring pattern of the conductive film projected in a three-dimensional shape in a used state, respectively.
Figure 1B:
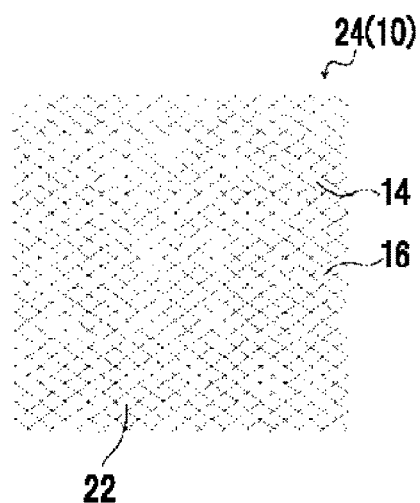
Figure 2:
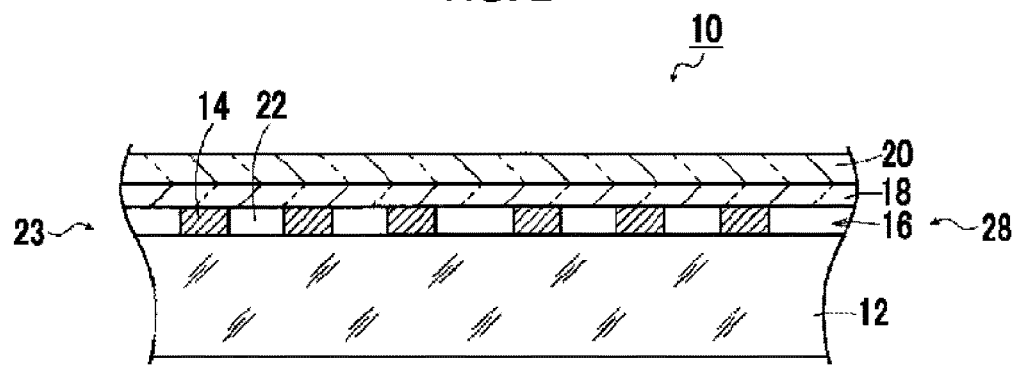
FIG. 2 is a partial cross-sectional view schematically illustrating an example of the cross section of the conductive film having the planar wiring pattern illustrated in FIG. 1A.
Figure 3:
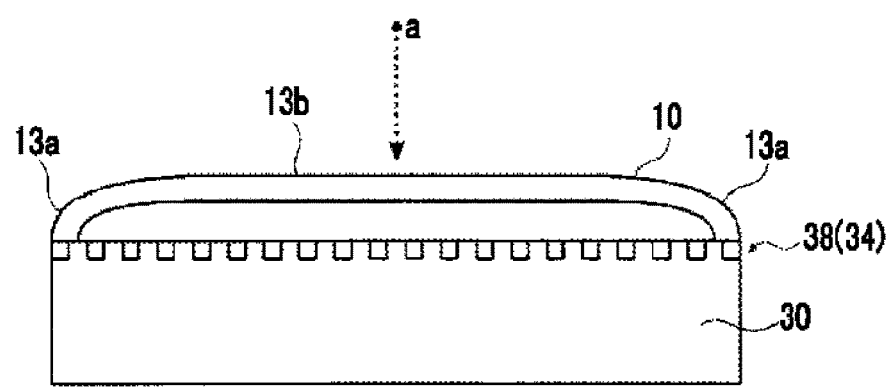
FIG. 3 is a diagram schematically illustrating the cross section of an example of the usage state of the three-dimensional shape of the conductive film illustrated in FIG. 2 and an example of an observation point.
Figure 4:
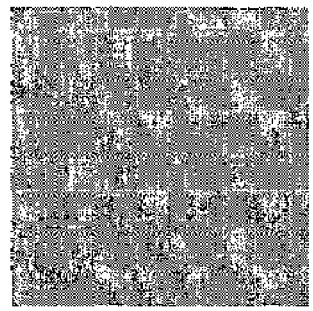
FIG. 4 is a diagram schematically illustrating moire which is seen from the conductive film having the projection wiring pattern with a three-dimensional shape in the usage state illustrated in FIG. 1B.

FIGS. 1A and 1B are diagrams schematically illustrating an example of a planar wiring pattern of a conductive film according to a first embodiment of the invention in a planar state and a projection wiring pattern of the conductive film which is projected in a three-dimensional shape in a used state, respectively. FIG. 2 is a partial cross-sectional view schematically illustrating an example of the cross section of the conductive film having the planar wiring pattern illustrated in FIG. 1A. FIG. 3 is a diagram schematically illustrating the cross section of an example of the usage state of the three-dimensional shape of the conductive film illustrated in FIG. 2 and an example of an observation point. FIG. 4 is a diagram schematically illustrating moire which is seen from the conductive film having the projection wiring pattern with the three-dimensional shape in the usage state illustrated in FIG. 1B.

As illustrated in FIGS. 1A and 1B and FIG. 2, a conductive film 10 according to this embodiment includes a transparent base 12, a conductive portion 16 that is formed on one surface (an upper surface in FIG. 2) of the transparent base 12 and includes a plurality of thin metal wires (hereinafter, referred to as thin metal wires) 14, and a protective layer 20 that is provided substantially on the entire surface of the conductive portion 16, with an adhesive layer 18 interposed therebetween, so as to cover the thin metal wires 14.

As illustrated in FIG. 3, the conductive film 10 is provided in a predetermined three-dimensional shape on a display unit 30 of a display device and is then used. The conductive film 10 has a planar shape and has a planar wiring pattern 23 illustrated in FIG. 1A before it is used, that is, before it is provided on the display unit 30. However, when the conductive film 10 is viewed from one point of view represented by an arrow a, with being provided in a predetermined three-dimensional shape on the display unit 30, as illustrated in FIG. 3, the planar wiring pattern 23 of the conductive film 10 illustrated in FIG. 1A can be seen as a projection wiring pattern 24 which is projected in a predetermined three-dimensional shape, as illustrated in FIG. 1B. The conductive film 10 is a conductive film having the projection wiring pattern 24 which is effective in preventing the occurrence of moire with respect to the pattern (BM pattern 38) of a black matrix (BM) 34 of the display unit 30, that is, the projection wiring pattern 24 having a moire evaluation index in a predetermined range in which moire is not seen, particularly, a conductive film having the planar wiring pattern 23 that becomes the projection wiring pattern 24 which is optimized in terms of the visibility of moire with respect to the BM pattern 38 when it is superimposed in a three-dimensional shape on the BM pattern 38, as illustrated in FIG. 4.

The conductive film 10 may be formed in advance so as to have the projection wiring pattern 24 which has a three-dimensional shape in a usage state in which it is provided on the display unit 30, as viewed from one point of view represented by the arrow a in FIG. 3. In addition, the conductive film 10 may be flexible such that it has a planar shape having the planar wiring pattern 23 before it is used and is deformed into a three-dimensional shape to have the projection wiring pattern 24, as viewed from one point of view represented by the arrow a in FIG. 3, in order to be provided on the display unit 30 when it is used.

In the conductive film according to the invention, an index for evaluating moire which occurs due to the interference between the BM pattern and the projection wiring pattern obtained by projecting the planar wiring pattern, which is expanded in a planar shape, in a three-dimensional shape in the usage state, as seen from at least one point of view, is within a predetermined range in which moire is not seen. The moire evaluation index, the predetermined range in which moire is not seen, and the optimization of the visibility of moire will be described below.

Here, as illustrated in FIG. 3, the conductive film 10 has a three-dimensional shape having curved portions 13a that are curved with a predetermined curvature in both peripheral portions corresponding to a display surface of the display unit 30 and a planar portion 13b that is parallel to the display surface of the display unit 30 between the two curved portions 13a. However, the three-dimensional shape of the conductive film 10 is not limited thereto. The conductive film 10 may have any three-dimensional shape as long as it corresponds to the shape of the display surface of the display unit 30. In the example illustrated in FIG. 3, a three-dimensional shape in a direction perpendicular to the plane of paper is not illustrated. However, the conductive film 10 may also have the curved portions 13a in both peripheral portions in the direction perpendicular to the plane of paper. Conversely, the conductive film 10 may have the same cross-sectional shape in the direction perpendicular to the plane of paper. In this case, it is preferable that the display surface of the display unit 30 has a rectangular shape. However, the shape of the display surface of the display unit 30 is not particularly limited. The display surface of the display unit 30 may have an elliptical shape, a circular shape, or other shapes.

Here, one observation point for observing the display surface of the display unit 30 on which the conductive film 10 having the three-dimensional shape is provided is a point of view which is on a straight line extending from the display surface of the display unit 30 or the planar portion 13b of the conductive film 10 parallel to the display surface, preferably, the center of the conductive film 10 to the outside in a direction perpendicular to the display surface or the planar portion 13b, that is, the point of view a which is in front of the display surface and is represented by the arrow a, as illustrated in FIG. 3. However, the invention is not limited thereto. The conductive film 10 may be observed from a point of view that is different from the point of view a. For example, as illustrated in FIG. 5, the conductive film 10 having the same three-dimensional shape may be observed from a point of view b which is in front of the curved portion 13a of the conductive film 10 and is represented by an arrow b.

Figure 5:
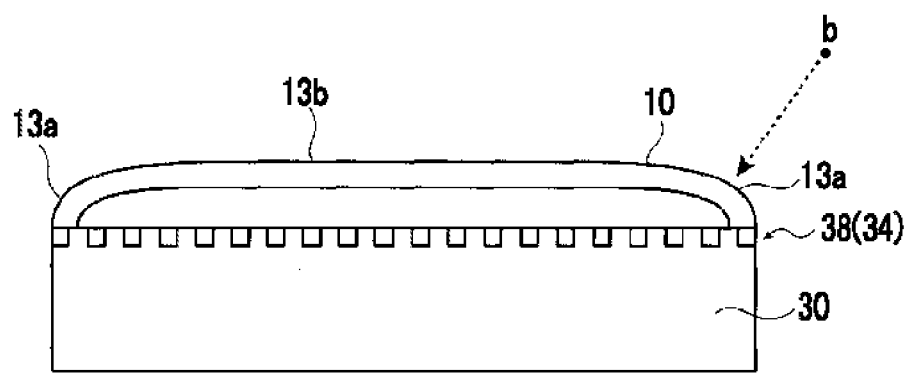
FIG. 5 is a diagram schematically illustrating another example of the usage state of the three-dimensional shape of the conductive film illustrated in FIG. 2 and the observation point.
Figure 6A:
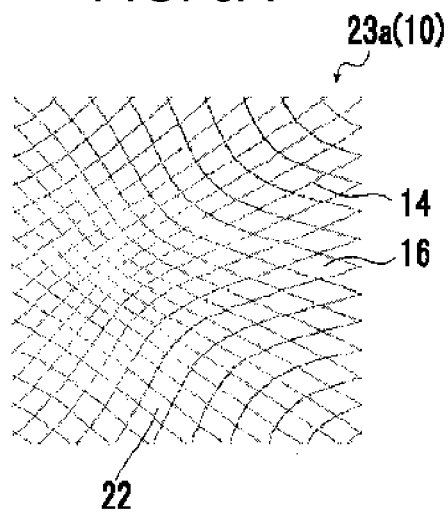
FIGS. 6A and 6B are diagrams schematically illustrating another example of the planar wiring pattern of the conductive film according to the first embodiment of the invention in the planar state and the projection wiring pattern of the conductive film projected in the three-dimensional shape in the used state, respectively.
Figure 6B:
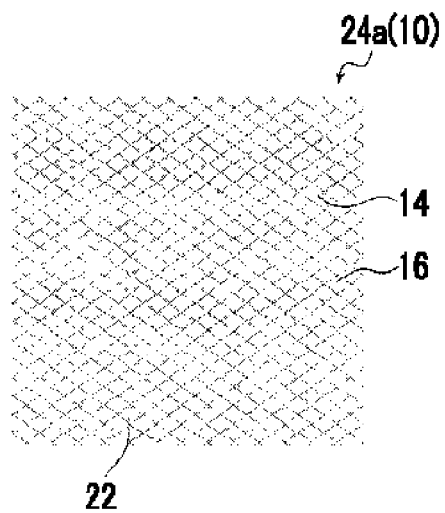

FIG. 6A illustrates a planar wiring pattern 23a of the conductive film 10, which is observed from the point of view b illustrated in FIG. 5, in a planar state and FIG. 6B illustrates a projection wiring pattern 24a which is projected in a three-dimensional shape in a used state. The projection wiring pattern 24a illustrated in FIG. 6B may be any pattern as long as it is observed as the same mesh pattern as the projection wiring pattern 24 illustrated in FIG. 1B. Even when the projection wiring patterns 24 and 24a are the same mesh pattern, the planar wiring pattern 23a illustrated in FIG. 6A is a different mesh pattern from the planar wiring pattern 23 illustrated in FIG. 1A.

In the invention, the projection wiring pattern 24 in which the visibility of moire is high and an index for evaluating the visibility of moire is within a predetermined range in which moire is not seen in the entire portion having a three-dimensional shape, for example, as viewed from all points of views from the point of view a to the point of view b in the examples illustrated in FIG. 3 and FIG. 5, and the planar wiring pattern 23 obtained by expanding the projection wiring pattern 24 in a planar shape are described as the most preferable and optimized mesh patterns of the invention. However, the invention is not limited thereto. For example, the projection wiring pattern 24 and the planar wiring pattern 23 expanded in a planar shape may be any pattern in which the visibility of moire is high, when viewed from at least a point of view from which the display surface of the display unit 30 is best observed, for example, a point of view including the point of view a in front of the flat portion illustrated in FIG. 3 or the point of view b in front of the curved portion illustrated in FIG. 5.

The transparent base 12 is made of a material having insulating properties and high translucency, such as a resin, glass, and silicon. Examples of the resin include polyethylene terephthalate (PET), polymethyl methacrylate (PMMA), polypropylene (PP), and polystyrene (PS). When the planar conductive film 10 is deformed into a three-dimensional shape and is then used, it is preferable that the transparent base 12 of the conductive film 10 is made of a flexible material, for example, a resin material. In contrast, when the conductive film 10 is formed in a three-dimensional shape in advance, it may be made of a resin material or a material such as glass or silicon.

The conductive portion 16 is a conductive layer 28 including the thin metal wires 14 and the planar wiring pattern 23 having a mesh shape which is formed by openings 22 between adjacent thin metal wires 14, as illustrated in FIG. 1A and FIG. 2. As illustrated in FIG. 1B, the planar wiring pattern 23 is projected in a three-dimensional shape and becomes the projection wiring pattern 24 when the conductive film 10 is deformed into a three-dimensional shape.

The thin metal wires 14 are not particularly limited as long as they are thin wires made of metal with high conductivity, such as gold (Au), silver (Ag), or copper (Cu). It is preferable that the thin metal wire 14 has a small width in terms of visibility. For example, the width of the thin metal wire 14 may be equal to or less than 30 μm. When the thin metal wire 14 is used for a touch panel, the width of the thin metal wire 14 is preferably equal to or greater than 0.1 μm and equal to or less than 15 μm, more preferably equal to or greater than 1 μm and equal to or less than 9 μm, and most preferably equal to or greater than 2 μm and equal to or less than 7 μm.

Specifically, the conductive portion 16 has the planar wiring pattern 23 (see FIG. 1A) in which a plurality of thin metal wires 14 are arranged in a mesh shape and has the projection wiring pattern 24 (see FIG. 1B) in a three-dimensional shape. In the projection wiring pattern 24 illustrated in FIG. 1B, the mesh shape of the opening 22 is a rhombic shape. However, the invention is not limited thereto. The opening 22 may have any polygonal shape having at least three sides as long as it can form the projection wiring pattern 24 in which the visibility of moire is optimized for a predetermined BM pattern 38 which will be described below. The openings 22 may have the same mesh shape or different mesh shapes. Examples of the mesh shape include the same or different polygons including a triangle, such as an equilateral triangle, or an isosceles triangle, a quadrangle (rectangles), such as a square (square lattice: see FIG. 23D), a parallelogram (rhombus: see FIG. 23A), or a rectangle, a pentagon, and a hexagon (regular hexagon: see FIG. 23B and FIG. 23C). That is, a wiring pattern formed by the regular arrangement of the openings 22 or a wiring pattern formed by the random arrangement of the openings 22 having different shapes may be used as long as it is a wiring pattern having moire visibility optimized for a predetermined BM pattern 38.

In addition, the projection wiring pattern 24 may have breaks, which will be described below.

Figure 7A:
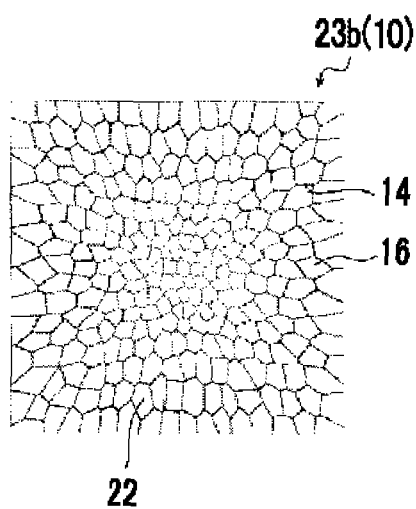
FIGS. 7A and 7B are diagrams schematically illustrating another example of the planar wiring pattern of the conductive film according to the first embodiment of the invention in the planar state and the projection wiring pattern of the conductive film projected in the three-dimensional shape in the used state, respectively.
Figure 7B:
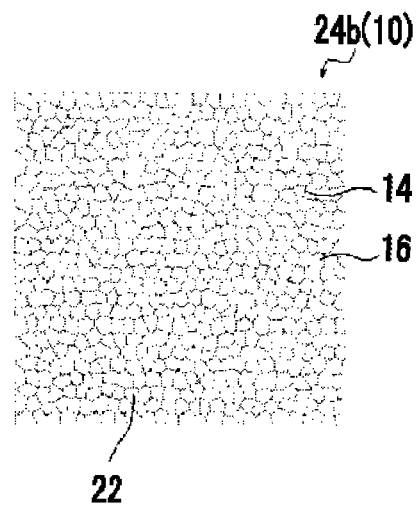

For example, FIG. 7A illustrates a planar random wiring pattern 23b according to the invention which is randomized and FIG. 7B illustrates a projection random wiring pattern 24b obtained by projecting the planar random wiring pattern 23b in a three-dimensional shape. The projection random wiring pattern 24b is seen when it is observed from the point of view a illustrated in FIG. 3 which is in front of the display surface.

When the planar random wiring pattern 23b illustrated in FIG. 7A is projected in the three-dimensional shape illustrated in FIG. 3 and is observed from the point of view a, the projection random wiring pattern 24b illustrated in FIG. 7B is seen.

Examples of the material forming the adhesive layer 18 include a wet lamination adhesive, a dry lamination adhesive, and a hot melt adhesive.

Similarly to the transparent base 12, the protective layer 20 is made of a material having high translucency, such as a resin, glass, or silicon. It is preferable that the refractive index n1 of the protective layer 20 is equal to the refractive index n0 of the transparent base 12 or is a value close to the refractive index n0. In this case, the relative refractive index nr1 of the transparent base 12 with respect to the protective layer 20 is a value close to 1.

In the specification, the refractive index means a refractive index with respect to light with a wavelength of 589.3 nm (sodium D ray). For example, the refractive index of a resin is defined by ISO 14782:1999 (corresponding to JIS K 7105) that is an international standard. In addition, the relative refractive index nr1 of the transparent base 12 with respect to the protective layer 20 is defined as nr1=(n1/n0). Here, the relative refractive index nr1 is preferably equal to or greater than 0.86 and equal to or less than 1.15 and more preferably equal to or greater than 0.91 and equal to or less than 1.08.

It is possible to further increase and improve the visibility of moire by limiting the relative refractive index nr1 to the above-mentioned range and controlling the light transmittance of the members between the transparent base 12 and the protective layer 20.

In the conductive film 10 according to the first embodiment, the conductive portion 16 is provided on only one surface of the transparent base 12. However, the invention is not limited thereto. The conductive portions may be provided on both surfaces of the transparent base 12.

Figure 8:
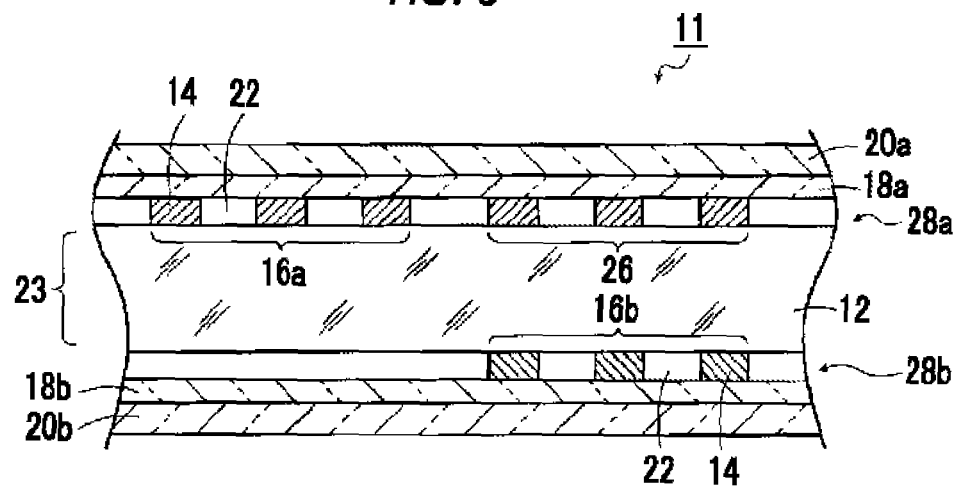
FIG. 8 is a partial cross-sectional view schematically illustrating an example of a conductive film according to a second embodiment of the invention.

FIG. 8 is a partial cross-sectional view schematically illustrating an example of a conductive film according to a second embodiment of the invention. The plan view of the conductive film according to the second embodiment illustrated in FIG. 8 is the same as the plan view of the conductive film according to the first embodiment illustrated in FIG. 1 and thus the description thereof will not be repeated.

As illustrated in FIG. 8, a conductive film 11 according to the second embodiment includes a first conductive portion 16a and a dummy electrode portion 26 which are formed on one surface (on the upper side in FIG. 8) of a transparent base 12, a second conductive portion 16b which is formed on the other surface (on the lower side in FIG. 8) of the transparent base 12, a first protective layer 20a which is bonded to substantially the entire surfaces of the first conductive portion 16a and the dummy electrode portion 26, with a first adhesive layer 18a interposed therebetween, and a second protective layer 20b which is bonded to substantially the entire surface of the second conductive portion 16b, with a second adhesive layer 18b interposed therebetween.

In the conductive film 11, the first conductive portion 16a and the dummy electrode portion 26 each include a plurality of thin metal wires 14 and are formed as a conductive layer 28a on one surface (on the upper side in FIG. 8) of the transparent base 12. The second conductive portion 16b includes a plurality of thin metal wires 14 and is formed as the conductive layer 28b on the other surface (on the lower side in FIG. 8) of the transparent base 12. Here, the dummy electrode portion 26 is formed on one surface (on the upper side in FIG. 8) of the transparent base 12, similarly to the first conductive portion 16a, and includes the plurality of thin metal wires 14 which are similarly arranged at positions corresponding to the plurality of thin metal wires 14 of the second conductive portion 16b formed on the other surface (on the lower side in FIG. 8), as in the example illustrated in FIG. 8.

The dummy electrode portion 26 is arranged so as to be separated from the first conductive portion 16a by a predetermined distance and is electrically insulated from the first conductive portion 16a.

In the conductive film 11 according to this embodiment, the dummy electrode portion 26 including the plurality of thin metal wires 14 corresponding to the plurality of thin metal wires 14 of the second conductive portion 16b formed on the other surface (on the lower side in FIG. 8) of the transparent base 12 is formed on one surface (on the upper side in FIG. 8) of the transparent base 12. Therefore, it is possible to control scattering due to the thin metal wires on the one surface (on the upper side in FIG. 8) of the transparent base 12 and to improve the visibility of the electrode.

Here, the first conductive portion 16a and the dummy electrode portion 26 of the conductive layer 28a have a mesh-shaped planar wiring pattern 23 formed by the thin metal wires 14 and openings 22. The planar wiring pattern 23 becomes a projection wiring pattern 24 in the conductive film 11 with a three-dimensional shape. In addition, the second conductive portion 16b of the conductive layer 28b have a mesh-shaped planar wiring pattern 23 formed by the thin metal wires 14 and openings 22, similarly to the first conductive portion 16a. The planar wiring pattern 23 becomes the projection wiring pattern 24 in the conductive film 11 with a three-dimensional shape. As described above, the transparent base 12 is made of an insulating material and the second conductive portion 16b is electrically insulated from the first conductive portion 16a and the dummy electrode portion 26.

Furthermore, the first and second conductive portions 16a and 16b and the dummy electrode portion 26 each can be similarly formed of the same materials as the conductive portion 16 of the conductive film 10 illustrated in FIG. 2.

The first protective layer 20a is bonded to the substantially entire surface of the conductive layer 28a including the first conductive portion 16a and the dummy electrode portion 26 by the first adhesive layer 18a so as to cover the thin metal wires 14 of each of the first conductive portion 16a and the dummy electrode portion 26.

The second protective layer 20b is bonded to substantially the entire surface of the conductive layer 28b including the second conductive portion 16b by the second adhesive layer 18b so as to cover the thin metal wires 14 of the second conductive portion 16b.

Here, the first adhesive layer 18a and the second adhesive layer 18b each can be similarly formed of the same material as the adhesive layer 18 of the conductive film 10 illustrated in FIG. 2. The first adhesive layer 18a and the second adhesive layer 18b may be made of the same material or different materials.

The first protective layer 20a and the second protective layer 20b each can be similarly formed of the same material as the protective layer 20 of the conductive film 10 illustrated in FIG. 2. The first protective layer 20a and the second protective layer 20b may be made of the same material or different materials.

The refractive index n2 of the first protective layer 20a and the refractive index n3 of the second protective layer 20b are each equal or close to the refractive index n0 of the transparent base 12, similarly to the protective layer 20 of the conductive film 10 according to the first embodiment. In this case, the relative refractive index nr2 of the transparent base 12 with respect to the first protective layer 20a and the relative refractive index nr3 of the transparent base 12 with respect to the second protective layer 20b are each close to 1. Here, the definition of the refractive index and the relative refractive index is the same as that in the first embodiment. Therefore, the relative refractive index nr2 of the transparent base 12 with respect to the first protective layer 20a is defined as nr2=(n2/n0) and the relative refractive index nr3 of the transparent base 12 with respect to the second protective layer 20b is defined as nr3=(n3/n0).

Here, similarly to the relative refractive index nr1, the relative refractive index nr2 and the relative refractive index nr3 are preferably equal to or greater than 0.86 and equal to or less than 1.15 and more preferably equal to or greater than 0.91 and equal to or less than 1.08.

It is possible to further improve the visibility of moire by limiting the relative refractive index nr2 and the relative refractive index nr3 to the above-mentioned range, similarly to the limitation of the range of the relative refractive index nr1.

Figure 9:
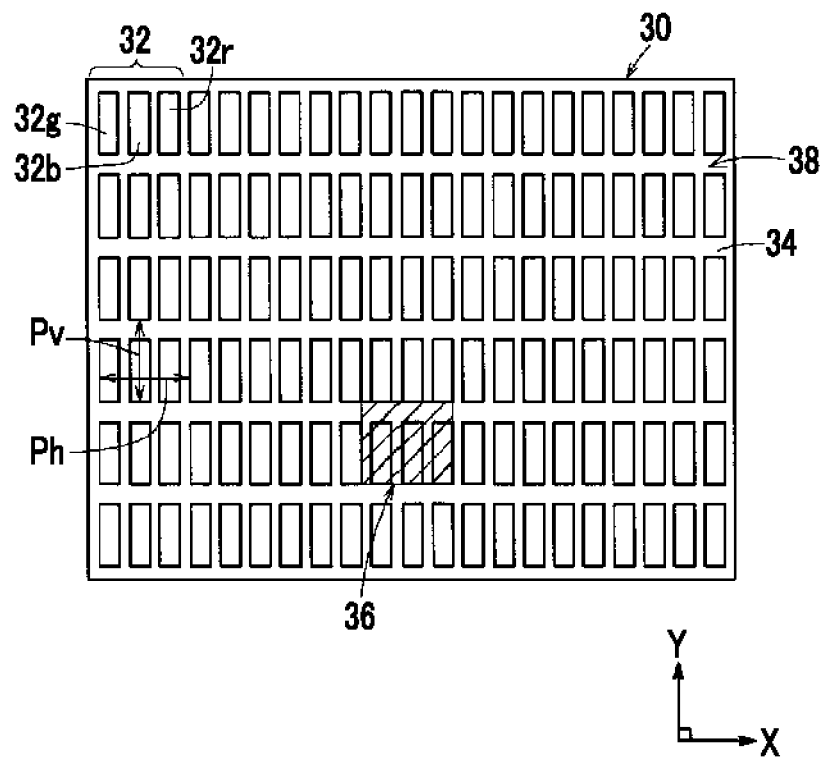
FIG. 9 is a diagram schematically illustrating an example of a pixel array pattern in a portion of a display unit to which the conductive film according to the invention is applied.

The conductive film 10 according to the first embodiment and the conductive film 11 according to the second embodiment of the invention are applied to, for example, a touch panel of a display unit 30 (display section), a part of which is schematically illustrated in FIG. 9. The conductive films 10 and 11 with a three-dimensional shape have the projection wiring pattern 24 (24a and 24b) which is optimized for the pixel array pattern, that is, the black matrix (hereinafter, also referred to as a "BM") pattern 38 of the display unit 30 in terms of the visibility of moire, as seen from at least one point of view, for example, the point of view a. The conductive films 10 and 11 with a planar shape have the planar wiring pattern 23 (23a and 23b) obtained by expanding the projection wiring pattern 24 (24a and 24b) in a planar shape. In the invention, the projection wiring pattern which is optimized for a predetermined BM pattern in terms of the visibility of moire and the planar wiring pattern obtained by expanding the projection wiring pattern in a planar shape mean a projection wiring pattern or a group of two or more projection wiring patterns which are optimized for the predetermined BM pattern so that moire is not seen by the human eye and a planar wiring pattern obtained by expanding the projection wiring pattern in a planar shape, respectively.

Moire is seen due to the interference between the BM pattern of the display unit 30 and the projection wiring pattern which is projected in a three-dimensional shape and is superimposed on the BM pattern. Therefore, for the visibility of moire, the projection wiring pattern with a three-dimensional shape will be described and the planar wiring pattern with a planar shape will not be described. The planar wiring pattern with a planar shape used in the invention may be obtained by expanding the projection wiring pattern obtained in the invention from a three-dimensional shape to a two-dimensional shape or by back projection.

In the following description of the visibility of moire, in some cases, the projection wiring pattern with a three-dimensional shape is simply referred to as a wiring pattern. However, when the projection wiring pattern with a three-dimensional shape needs to be distinguished from the planar wiring pattern with a planar shape, it is referred to as a projection wiring pattern.

In the invention, in one group of two or more optimized wiring patterns, the wiring patterns can be ranked from a wiring pattern which is least likely to be perceived to a wiring pattern which is less likely to be perceived and it is possible to determine one wiring pattern with the lowest visibility of moire.

The conductive film according to the invention has the above-mentioned basic structure.

FIG. 9 is a diagram schematically illustrating an example of the pixel array pattern in a part of the display unit to which the conductive film according to the invention is applied.

As partially illustrated in FIG. 9, the display unit 30 has a plurality of pixels 32 which are arranged in a matrix to form a predetermined pixel array pattern. One pixel 32 includes three sub-pixels (a red sub-pixel 32r, a green sub-pixel 32g, and a blue sub-pixel 32b) which are arranged in a horizontal direction. One sub-pixel has a rectangular shape which is long in a vertical direction. The pitch between the pixels 32 in the horizontal direction (horizontal pixel pitch Ph) is substantially equal to the pitch between the pixels 32 in the vertical direction (vertical pixel pitch Pv). That is, a shape (see a hatched region 36) formed by one pixel 32 and a black matrix (BM) 34 (pattern material) surrounding the one pixel 32 is a square. The aspect ratio of one pixel 32 is not 1, but satisfies the following relationship: [the length of the pixel in the horizontal direction (lateral direction)]>[the length of the pixel in the vertical direction (longitudinal direction)].

As can be seen from FIG. 9, the pixel array pattern formed by the sub-pixels 32r, 32g, and 32b of the plurality of pixels 32 is defined by a BM pattern 38 of the BM 34 that surrounds each of the sub-pixels 32r, 32g, and 32b. Moire occurs when the conductive film 10 or 11 is superimposed on the display unit 30 due to the interference between the BM pattern 38 of the BM 34 of the display unit 30 and the projection wiring pattern 24 of the conductive film 10 or 11. Therefore, strictly, the BM pattern 38 is an inverse pattern of the pixel array pattern. However, in this embodiment, the BM pattern 38 and the pixel array pattern are treated as the same pattern.

For example, when the conductive film 10 or 11 is arranged on the display panel of the display unit 30 having the BM pattern 38 formed by the BM 34, the projection wiring pattern 24 of the conductive film 11 is optimized for the BM (pixel array) pattern 38 in terms of the visibility of moire. Therefore, there is little spatial frequency interference between the array period of the pixels 32 and the wiring arrangement of the thin metal wires 14 of the conductive film 10 or 11 and the occurrence of moire is prevented.

The display unit 30 illustrated in FIG. 9 may be a display panel such as a liquid crystal panel, a plasma panel, an organic EL panel, and an inorganic EL panel.

Figure 10:
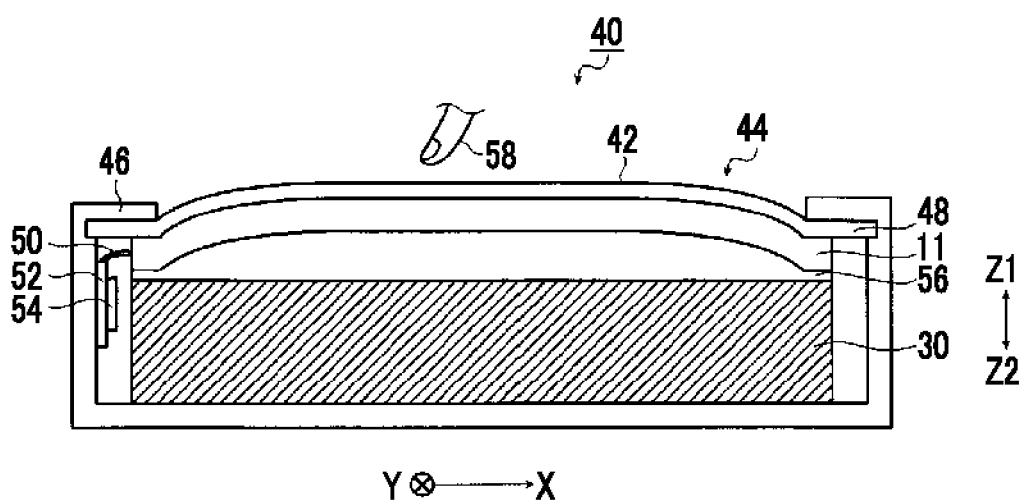
FIG. 10 is a diagram schematically illustrating an example of a display device into which the conductive film illustrated in FIG. 9 is incorporated.

Next, a display device into which the conductive film according to the invention is incorporated will be described below with reference to FIG. 10. In FIG. 10, a projection capacitive touch panel into which the conductive film 11 according to the second embodiment of the invention is incorporated is given as a representative example of a display device 40. However, the invention is not limited thereto.

As illustrated in FIG. 10, the display device 40 includes the display unit 30 (see FIG. 9) that can display a color image and/or a monochrome image, a touch panel 44 with a three-dimensional shape that detects a contact position on an input surface 42 with a three-dimensional shape (in the direction of an arrow Z1), and a housing 46 that accommodates the display unit 30 and the touch panel 44. The user can access the touch panel 44 through a large opening which is provided in one surface (in the direction of the arrow Z1) of the housing 46.

The touch panel 44 includes a cover member 48 that is stacked on one surface (in the direction of the arrow Z1) of the conductive film 11, a flexible substrate 52 that is electrically connected to the conductive film 11 through a cable 50, and a detection control unit 54 that is provided on the flexible substrate 52, in addition to the conductive film 11 with a three-dimensional shape (see FIGS. 1 and 8).

The conductive film 11 with a three-dimensional shape is bonded to a flat surface (in the direction of the arrow Z1) of the display unit 30, with an adhesive layer 56 interposed therebetween. The other main surface (the second conductive portion 16b) of the conductive film 11 with a three-dimensional shape faces the display unit 30 and the conductive film 11 is curved in a three-dimensional shape on the display screen.

The cover member 48 covers one surface of the conductive film 11 which is curved in a three-dimensional shape in the same shape as the conductive film 11 and functions as the input surface 42. In addition, the cover member 48 prevents the direct contact of a contact body 58 (for example, a finger or a stylus pen), which makes it possible to prevent, for example, the occurrence of scratches and the adhesion of dust. Therefore, it is possible to stabilize the conductivity of the conductive film 11.

The cover member 48 may be made of any material as long as it can have the same three-dimensional shape as the conductive film 11. For example, the cover member 48 may be made of glass or a resin film. The cover member 48 may closely adhere to one surface (in the direction of the arrow Z1) of the conductive film 11, with one surface (in the direction of an arrow Z2) being coated with, for example, a silicon oxide. The conductive film 11 and the cover member 48 may be attached to each other in order to prevent damage due to, for example, friction.

The flexible substrate 52 is an electronic substrate having flexibility. In the example illustrated in FIG. 10, the flexible substrate 52 is fixed to the inner side wall of the housing 46. However, the position where the flexible substrate 52 is provided may vary. The detection control unit 54 forms an electronic circuit that detects a change in the capacitance between the contact body 58 and the conductive film 11 and detects a contact position (or an approach position) when the contact body 58 which is a conductor comes into contact with (approaches) the input surface 42.

The display device to which the conductive film according to the invention is applied basically has the above-mentioned structure.

In the conductive film according to the invention, the index for evaluating moire which occurs due to the interference between the BM pattern and the projection wiring pattern obtained by projecting the planar wiring pattern, which is expanded in a planar shape, in a three-dimensional shape in a usage state as seen from at least one point of view is within a predetermined range in which moire is not seen.

Therefore, hereinafter, an index for evaluating the visibility of moire in the projection wiring pattern of the conductive film with respect to a predetermined BM pattern of the display device, a predetermined range according to the invention in which the evaluation index needs to be satisfied and moire is not seen, the optimization of the visibility of moire, and an optimization process will be described.

FIG. 11 is a flowchart illustrating an example of a method for evaluating and determining the projection wiring pattern of the conductive film according to the invention.

Hereinafter, an example of an evaluation and determination method will be described which includes a plurality of processes of evaluating a projection wiring pattern (hereinafter, simply referred to as a wiring pattern) that is optimized for a predetermined BM pattern of the display device such that moire is not seen by the human eye and determining the projection wiring pattern in the conductive film according to the invention. In addition, the moire visibility evaluation index used in the invention and the predetermined range in which the moire visibility evaluation index needs to be satisfied will be described. However, the invention is not limited thereto. For example, any moire visibility evaluation index may be used as long as it can evaluate the visibility of moire and a predetermined range in which the moire visibility evaluation index needs to be satisfied can be specified.

In addition, the predetermined range in which the evaluation index needs to be satisfied may be specified depending on the evaluation index used.

The method for evaluating and determining the wiring pattern of the conductive film according to the invention calculates the frequency and intensity of moire from a peak frequency and intensity which are obtained by frequency analysis using fast Fourier transform (FFT) for the BM (pixel array) pattern of the display unit of the display device and the wiring pattern of the conductive film, empirically determines the frequency and intensity of moire which is not seen from the calculated frequency and intensity of moire, and evaluates and determines a wiring pattern satisfying these conditions to be a wiring pattern that is optimized such that moire is not seen. In the method according to the invention, FFT is generally used for the frequency and intensity of moire. However, the frequency and intensity of a target greatly vary depending on the method used. Therefore, the following processes are defined.

Here, a case in which one point of view is in front of the display screen of the display unit of the display device is considered. However, the invention is not limited thereto. For example, the display screen may be seen from any point of view as long as the visibility of moire is improved as seen from at least one point of view.

In the method according to the invention, first, as Process 1, the images (transmittance image data) of the BM pattern and the wiring pattern are created. That is, as illustrated in FIG. 11, in Step S10, the transmittance image data of the BM pattern 38 (BM 34) (see FIG. 9 and FIGS. 12A and 12C) of the display unit 30 of the display device 40 illustrated in FIG. 10 and the transmittance image data of a wiring pattern 62 (thin metal wires 14) of a conductive film 60 (see FIG. 12B) are created and acquired. When the transmittance image data of the BM pattern 38 and the transmittance image data of the wiring pattern 62 are prepared or stored in advance, the transmittance image data may be acquired from the prepared or stored transmittance image data.

In particular, the transmittance image data of the wiring pattern (projection wiring pattern) 62 of the conductive film 60 with a three-dimensional shape may be created from an image which is obtained by capturing the conductive film (product) 60 from an observation point, with the conductive film 60 as a product being actually attached to the display surface (is not illuminated) of the display unit 30 in a three-dimensional shape, which will be described below. In addition, the transmittance image data may be reproduced as a three-dimensional model in a simulation space, using the three-dimensional shape data and two-dimensional (planar) wiring pattern data of the conductive film (product) 60 and an image obtained when the reproduced three-dimensional model is observed from a given observation point may be created by a projection simulation.

For example, as illustrated in FIG. 12A and FIG. 12C, which is a partially enlarged view of FIG. 12A, in the BM pattern 38 of the display unit 30, each pixel 32 can include three R, G, and B sub-pixels 32r, 32g, and 32b. When a single color is use, for example, when only a G-channel sub-pixel 32g is used, as illustrated in FIG. 12D, it is preferable that the transmittance image data of R and B channels is set to 0. In the invention, the image data of the BM 34, that is, the transmittance image data of the BM pattern 38 is not limited to the pattern having rectangular (without a cutout) openings of the BM 34 illustrated in FIG. 9 or the pattern having substantially rectangular (with a cutout) openings (the sub-pixels 32r, 32g, and 32b) of the BM 34 illustrated in FIG. 12C. For example, the BM pattern may have openings with other shapes in the BM 34 as long as it can be used or a BM pattern having an arbitrary BM opening may be designated and used. For example, as described above, the BM pattern 38 is not limited to the pattern in which the opening has a simple rectangular shape illustrated in FIG. 9 or the pattern in which the opening has a rectangular shape with a cutout illustrated in FIG. 12C. As illustrated in FIG. 13A, the BM pattern 38 may be a pattern in which each pixel 32 has strip-shaped openings that are bent at a predetermined angle and includes three R, G, and B sub-pixels 32r, 32g, and 32b, a pattern in which each pixel 32 has openings with a curved strip shape, and a pattern in which each pixel 32 has hooked openings.

FIG. 13B illustrates a BM pattern when only a single color, that is, only a G-channel sub-pixel 32g is used, similarly to FIG. 12D.

The wiring pattern 62 of the conductive film 60 may be, for example, a rhombus pattern in which the thin metal wire 14, which is a wiring line, is inclined at a predetermined angle, for example, 45° [deg] with respect to a horizontal line as illustrated in FIG. 12B or a rhombus pattern in which the thin metal wire 14 is inclined at an angle of less than, for example, 45° [deg] as illustrated in FIG. 23A. As described above, the opening of the wiring pattern may have any shape. For example, the shape of the opening of the wiring pattern may be a regular hexagon or a square lattice illustrated in FIGS. 23B to 23D, which will be described below. In this case, the square lattice may be inclined at an angle of 45° [deg].

When the transmittance image data of the BM pattern 38 is created, the size of the transmittance image data of the BM pattern 38 is defined such that the transmittance image data has a high resolution of 12700 dpi and a pixel size is, for example, an integer multiple of the size of the BM pattern 38 closest to a size of 8193 (pixels)×8193 (pixels).

When the transmittance image data of the wiring pattern 62 is created, the size of the transmittance image data of the wiring pattern 62 is defined such that the transmittance image data has a resolution of 12700 dpi that is equal to the resolution of the BM pattern 38 and a pixel size is, for example, an integer multiple of the size of the wiring pattern 62 closest to a size of 8193 (pixels)×8193 (pixels), similarly to the BM pattern 38.

Next, as Process 2, two-dimensional fast Fourier transform (2DFFT (base 2) is performed for the transmittance image data created in Process 1. That is, as illustrated in FIG. 11, in Step S12, the 2DFFT (base 2) process is performed for the transmittance image data of each of the BM pattern 38 and the wiring pattern 62 created in Step S10 to calculate the peak frequencies and peak intensities of a plurality of spectrum peaks in two-dimensional Fourier spectrums of the transmittance image data of each of the BM pattern 38 and the wiring pattern 62. Here, the peak intensity is treated as an absolute value.

FIGS. 14A and 14B are diagrams illustrating the intensity characteristics of the two-dimensional Fourier spectrums of the transmittance image data items of the BM pattern 38 and the wiring pattern 62, respectively.

In FIGS. 14A and 14B, a white portion has high intensity and indicates a spectrum peak. Therefore, the peak frequency and peak intensity of each spectrum peak in each of the BM pattern 38 and the wiring pattern 62 are calculated from the results illustrated in FIGS. 14A and 14B. In other words, in the intensity characteristics of the two-dimensional Fourier spectrums of the BM pattern 38 and the wiring pattern 62 as illustrated in FIGS. 14A and 14B, the position of the spectrum peak on the frequency coordinates, that is, a peak position, indicates a peak frequency and the intensity of the two-dimensional Fourier spectrum at the peak position is peak intensity.

Here, the peak frequency and peak intensity of each spectrum peak in the BM pattern 38 and the wiring pattern 62 are calculated and acquired as follows.

First, in the acquisition of the peak frequency, in the calculation of peaks, the frequency peaks are calculated from the basic frequencies of the BM pattern 38 and the wiring pattern 62. This is because the transmittance image data to be subjected to the 2DFFT process is a discrete value and the peak frequency depends on the reciprocal of the image size. As illustrated in FIG. 15, the position of the frequency peak can be represented by a combination of an independent two-dimensional basic frequency vector component a(bar) on the horizontal axis u and an independent two-dimensional basic frequency vector component b(bar) on the vertical axis v. Therefore, the acquired peak positions naturally form a lattice shape.

That is, as illustrated in FIG. 16A, the positions of the spectrum peaks of the BM pattern 38 and the wiring pattern 62 on the frequency coordinates fxfy, that is, peak positions are given as the positions of lattice points, which have the reciprocal (lip (pitch)) of a pattern pitch as a lattice spacing, on the frequency coordinates fxfy.

FIG. 15 is a graph illustrating the positions of the frequency peaks in the BM pattern 38. The positions of the frequency peaks in the wiring pattern 62 can be calculated by the same method.

Figure 17A:
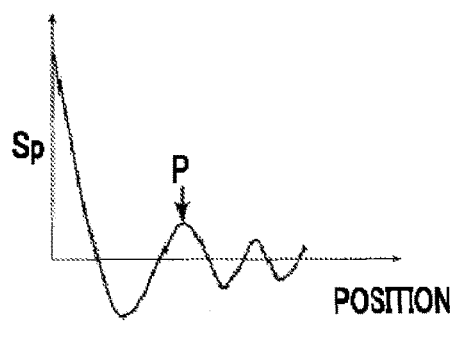
FIGS. 17A and 17B are a graph and a bar graph illustrating an example of the intensity characteristics of the two-dimensional Fourier spectrum with curves and bars, respectively.
Figure 17B:
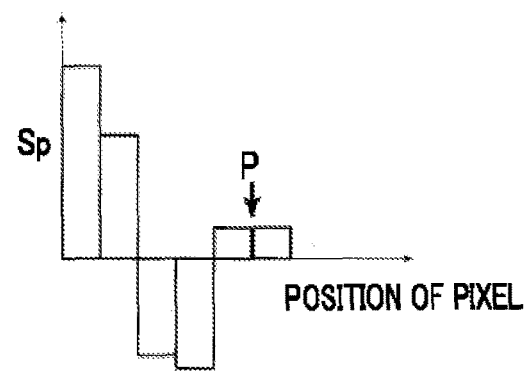

In the acquisition of the peak intensity, since the peak positions are calculated in the above-mentioned acquisition of the peak frequencies, the intensities (absolute values) of the two-dimensional Fourier spectrums at the peak positions are acquired. At this time, since the FFT process is performed for digital data, there is a case in which the peak position is located over a plurality of pixels. For example, when the intensity (Sp) characteristics of a two-dimensional Fourier spectrum are represented by a curve (analog values) illustrated in FIG. 17A, the digitized intensity characteristics of the two-dimensional Fourier spectrum are represented by a bar graph (digital values) illustrated in FIG. 17B. The intensity peak P of the two-dimensional Fourier spectrum illustrated in FIG. 17A is located over two pixels in FIG. 17B corresponding to FIG. 17A.

Therefore, as illustrated in FIG. 16B, when the intensity of the two-dimensional Fourier spectrum at the peak position is acquired, the sum of the intensities (absolute values) of a plurality of pixels, which are ranked in descending order of spectrum intensity, in a region including a plurality of pixels in the vicinity of the peak position, for example, five pixels, which are ranked in descending order of spectrum intensity, in a region including 7×7 pixels is preferably used as the peak intensity.

Here, it is preferable that the acquired peak intensity is normalized with an image area (image size). In the above-mentioned example, it is preferable that the peak intensity is normalized with an image size of 8193×8193 (Parseval's theorem).

Then, as Process 3, the frequency and intensity of moire are calculated. That is, as illustrated in FIG. 11, in Step S14, the frequency and intensity of moire are calculated from the peak frequencies and the peak intensities of the two-dimensional Fourier spectrums of the BM pattern 38 and the wiring pattern 62 calculated in Step S12, respectively. Here, the peak intensity and the intensity of moire are also treated as absolute values.

Since moire is essentially caused by the multiplication of the transmittance image data of the wiring pattern 62 and the BM pattern 38 in the real space, the convolution of the two patterns is performed in the frequency space. However, since the peak frequencies and the peak intensities of the two-dimensional Fourier spectrums of the BM pattern 38 and the wiring pattern 62 are calculated in Step S12, the difference (the absolute value of the difference) between the frequency peaks of the two patterns can be calculated. The calculated difference can be used as the frequency of moire. The product of two sets of vector intensities obtained by a combination of the two patterns can be calculated. The calculated product can be used as the intensity (absolute value) of moire.

Here, the difference between the frequency peaks in the intensity characteristics of the two-dimensional Fourier spectrums of the BM pattern 38 and the wiring pattern 62 which are respectively illustrated in FIGS. 14A and 14B corresponds to a relative distance between the positions of the frequency peaks of the two patterns on the frequency coordinates in the intensity characteristics which are acquired by superimposing the intensity characteristics of the two-dimensional Fourier spectrums of the two patterns.

Since the two-dimensional Fourier spectrum of each of the BM pattern 38 and the wiring pattern 62 has a plurality of spectrum peaks, a plurality of differences between the frequency peaks which are the values of the relative distance, that is, a plurality of moire frequencies are calculated. Therefore, when the two-dimensional Fourier spectrums each have a large number of spectrum peaks, a large number of moire frequencies are calculated and a large number of moire intensities are calculated.

However, when the intensity of moire at the calculated moire frequency is low, moire is not seen. Therefore, it is preferable to treat only moire with a predetermined value at which the intensity of moire is regarded to be low or a value greater than the predetermined value, for example, only moire with an intensity of −4 or more.

In the display device, since the display resolution has been determined, the maximum frequency of the display is determined depending on the resolution. Therefore, moire with a frequency higher than the maximum frequency is not displayed by the display and does not need to be an evaluation target in the invention. As a result, the maximum frequency of moire can be defined according to the resolution of the display. Here, when the pitch between the pixels in the pixel array pattern of the display is p (µm), the maximum frequency of moire to be considered in the invention can be 1000/(2p).

As described above, in the frequency and intensity of moire calculated from the spectrum peaks of the two two-dimensional Fourier spectrums, moire which has a frequency equal to or less than the maximum moire frequency of 1000/(2p) defined according to the resolution of the display and an intensity of −4 or more is an evaluation target in the invention.

As described above, when each of the two two-dimensional Fourier spectrums has a large number of spectrum peaks, a large number of moire frequencies are calculated and it takes a lot of time for the calculation process. In this case, among the spectrum peaks of the two two-dimensional Fourier spectrums, only the spectrum peaks with intensity higher than a predetermined value may be selected except for the spectrum peaks with low intensity. In this case, since only the difference between the selected peaks is calculated, it is possible to reduce the calculation time.

Figure 18:
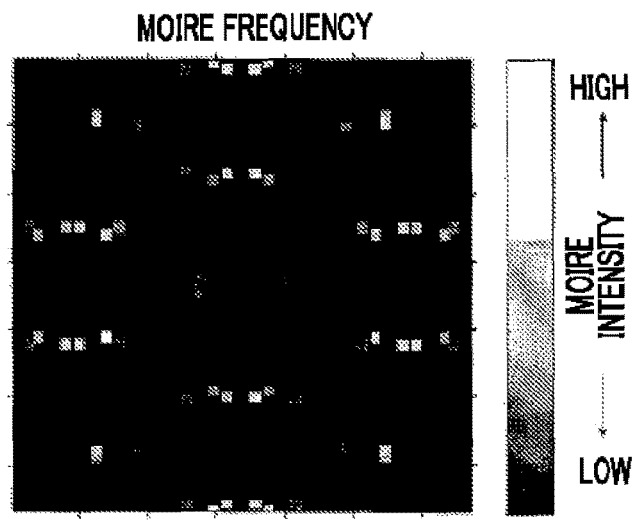
FIG. 18 is a diagram schematically illustrating the frequency and intensity of moire which occurs due to interference between the pixel array pattern illustrated in FIG. 12A and the projection wiring pattern illustrated in FIG. 12B.

FIG. 18 illustrates the calculated frequency and intensity of moire. FIG. 18 is a diagram schematically illustrating the frequency and intensity of the moire which occurs due to the interference between the pixel array pattern illustrated in FIG. 12A and the wiring pattern illustrated in FIG. 12B and also illustrates the result of the convolution between the intensity characteristics of the two-dimensional Fourier spectrums illustrated in FIGS. 14A and 14B.

In FIG. 18, the frequency of moire is represented by positions on the vertical and horizontal axes and the intensity of moire is represented by a gray scale (achromatic colors). For example, a darker color indicates lower intensity and a lighter color, that is, a color closer to white indicates higher intensity.

Then, as Process 4, a moire evaluation index is calculated and the evaluation of the wiring pattern and the determination of an optimized wiring pattern are performed on the basis of the evaluation index.

Specifically, first, as illustrated in FIG. 11, in Step S16, the human visual response characteristics represented by the following Expression (1) are applied to the frequency and intensity (absolute value) of moire obtained in Step S14 according to an observation distance, that is, convolution and weighting are performed therebetween to calculate a plurality of moire evaluation values (sub-evaluation values) which are weighted according to the observation distance. In other words, the frequency and intensity of moire are convolved with a visual transfer function (VTF) indicating an example of the human visual response characteristics represented by the following Expression (1):

$$S(u) = \frac{5200 e^{-0.0016 u^2 (1+100/L)^{0.08}}}{\sqrt{\left(1 + \frac{144}{X_o^2} + 0.64 u^2\right)\left(\frac{63}{L^{0.83}} + \frac{1}{1 - e^{-0.02 u^2}}\right)}} \quad \text{Expression (1)}$$

(where u is a spatial frequency (cycle/deg), L is brightness ($cd/mm^2$), $X_0$ is the viewing angle (deg) of the display surface of the display at the observation distance, and $X_0^2$ is the solid angle (sr) of the display surface of the display at the observation distance).

The visual transfer function represented by the above-mentioned Expression (1) is a contrast sensitivity function (CFS) S(u) represented by Expression (11) described on page 234 of the following paper: Peter G. J. Barten, "Formula for the contrast sensitivity of the human eye", Image Quality and System Performance, edited by Yoichi Miyake, D. Rene Rasmussen, Proc. of SPIE-IS&T Electronic Imaging, SPIE Vol. 5294° C. 2004 SPIE and IS&T 0277-786X/04/$15.00, pp. 231-238.

The above-mentioned Expression (1) can be appropriately used even in a transmission system, such as a display, unlike a Dooley-Shaw function illustrated in FIG. 20 that is generally used in a reflection system and has a fixed observation distance, which will be described below. Therefore, in the above-mentioned Expression (1), the observation distance and a difference in sensitivity due to the emission brightness of the display can be considered.

That is, in the invention, the one obtained frequency of moire is weighted by the contrast sensitivity S(u) calculated by the above-mentioned Expression (1) for a plurality of observation distances to calculate a plurality of moire evaluation values weighted by a coefficient corresponding to a plurality of observation distances.

Specifically, for example, when the frequency of moire is f and the intensity of moire is I, the frequency of moire is convolved with each observation distance d, for example, six observation distances d1 to d6 of 150 mm, 200 mm, 250 mm, 300 mm, 400 mm, and 500 mm which are likely to be considered when the display is used as a touch panel and is then weighted by a coefficient S depending on the observation distances d1 to d6 to obtain six evaluation values I1 to I6 corresponding to each observation distance.

In the invention, in the above-mentioned Expression (1), the unit of the spatial frequency u (cycle/deg) can be converted into a unit (cycle/mm) by Expression a=b·(π·d/180) (where d (mm) is the observation distance when a spatial frequency a (cycle/deg) is represented by a spatial frequency b (cycle/mm)).

The brightness L ($cd/mm^2$) may be the brightness of the display and may be, for example, 500 cd which is the brightness level of a general display at which moire is likely to be seen.

The viewing angle $X_0$ (deg) of the display surface of the display at the observation distance d may be adjusted and calculated depending on the observation distance d such that an evaluation area is the display surface of the display. For example, the viewing angle $X_0$ may be adjusted and calculated depending on the observation distance d such that the evaluation area is 40 mm×40 mm at which moire is likely to be seen when the display is used as a touch panel. The solid angle $X_0^2$ (sr) of the display surface of the display at the observation distance d may be calculated from the calculated viewing angle $X_0$.

Then, as illustrated in FIG. 11, in Step S18, in order to calculate an evaluation value (representative evaluation value) representing when the frequency of moire is f, the worst evaluation value among a plurality of moire evaluation values I1 to In depending on a plurality of (n) observation distances d1 to dn when the frequency of moire obtained in Step S16 is f is calculated and set as the representative evaluation value when the frequency of moire is f.

That is, in the evaluation index calculation method according to the invention, first, the worst value when convolution with the plurality of (n) observation distances d1 to dn is performed needs to be calculated and set as the representative evaluation value of the frequency f of moire.

For example, in the above-mentioned example, when the frequency of moire is f and the intensity of moire is I, the worst value among the six evaluation values I1 to I6 which are obtained by convolution with each observation distance, that is, the six observation distances d1 to d6 and weighting with the coefficient S depending on the observation distances d1 to d6 is set as the representative evaluation value when the frequency of moire is f. That is, the representative evaluation value of the moire with the frequency f can be determined to be max(I1, I2, I3, I4, I5, I6).

In this way, in Step S18, the worst evaluation value among a plurality of moire evaluation values I1 to In depending on a plurality of (n) observation distances d1 to do is calculated for all of the frequencies f of moire obtained in Step S14 and is evaluated and determined to be the representative evaluation value of the moire with the moire frequency f.

In the invention, the worst evaluation value among a plurality of moire evaluation values depending on the observation distances d is determined to be the representative evaluation value of the moire in order to evaluate the visibility of moire, without depending on the observation distance d, and to obtain an optimized wiring pattern.

Then, as illustrated in FIG. 11, in Step S20, all of the representative evaluation values (the worst evaluation values at the plurality of observation distances d) of moire which are obtained for all of the frequencies f of moire in the wiring pattern 62 in Step S18 are added to calculate a moire evaluation index. The value of the moire evaluation index is represented by a common logarithm. That is, the value (common logarithm value) of the moire evaluation index represented by the common logarithm is calculated.

Then, as illustrated in FIG. 11, in Step S22, when the calculated common logarithm value of the moire evaluation index of the wiring pattern 62 is equal to or less than a predetermined value, the wiring pattern 62 is evaluated to be the optimized wiring pattern 62 (24) of the conductive film 60 (10) with a three-dimensional shape according to the invention. The wiring pattern 62 is evaluated and determined to be the optimized wiring pattern 62 (24) and is set as the projection wiring pattern 24 of the conductive film 60 (10 or 11) with a three-dimensional shape according to the invention.

The reason why the common logarithm value of the moire evaluation index is limited to a predetermined value or less is that, when the common logarithm value of the moire evaluation index is greater than the predetermined value, moire which occurs due to the interference between the wiring pattern and the BM pattern superimposed on each other is likely to be seen and the user who sees the moire feels discomfort. When the value of the moire evaluation index is equal to or less than the predetermined value, the user is less likely to feel discomfort.

Here, the predetermined value is appropriately set according to the characteristics of the conductive film and the display device, specifically, the width of the thin metal wire 14, the shape, size (for example, pitch), or angle of the opening portion 22, and the phase angle (for example, the rotation angle or the deviation angle) between the wiring patterns of two conductive layers in the wiring pattern 62, and the shape, size (for example, pitch), or arrangement angle of the BM pattern 38. For example, it is preferable that the common logarithm of the moire evaluation index is equal to or less than −1.75 (the antilogarithm of the predetermined value is equal to or less than $10^{-1.75}$). That is, for example, the common logarithm of the value of the moire evaluation index is preferably equal to or less than −1.75 (the antilogarithm of the value of the moire evaluation index is equal to or less than $10^{-1.75}$), more preferably equal to or less than −1.89, still more preferably equal to or less than −2.05, and most preferably equal to or less than −2.28.

In addition, the moire evaluation indexes were calculated for simulation samples and actual samples of a plurality of wiring patterns 62 and three researchers performed visual sensory evaluation for moire which occurred due to the interference between the wiring pattern 62 and the BM pattern, which will be described in detail below. As a result, when the common logarithm of the moire evaluation index was equal to or less than −1.75, moire which occurred due to the interference between the wiring pattern and the BM pattern superimposed on each other was equal to or higher than a level at which the moire was seen, but caused slight discomfort. When the common logarithm of the moire evaluation index was equal to or less than −1.89, moire was equal to or higher than a level at which the moire was seen, but hardly caused discomfort. When the common logarithm of the moire evaluation index was equal to or less than −2.05, moire was equal to or higher than a level at which the moire was seen, but did not noticeably cause discomfort. When the common logarithm of the moire evaluation index was equal to or less than −2.28, moire was equal to or higher than a level at which the moire was seen, but did not cause discomfort at all.

Therefore, in the invention, the common logarithm of the moire evaluation index is specified to be preferably equal to or less than −1.75 (the antilogarithm of the moire evaluation index is $10^{-1.75}$), more preferably equal to or less than −1.89, still more preferably equal to or less than −2.05, and most preferably equal to or less than −2.28.

A plurality of optimized wiring patterns 62 are obtained according to, for example, the width of the thin metal wire 14 and the shape or size (pitch or angle) of the opening portion 22 in the wiring pattern 62, or the phase angle (the rotation angle or the deviation angle) between the wiring patterns of two conductive layers. Among the wiring patterns, a wiring pattern having a small common logarithm of the moire evaluation index is the best wiring pattern 62 and the plurality of optimized wiring patterns 62 can be ranked.

Then, in Step S24, the set projection wiring pattern 24 is expanded in a planar shape to determine the planar wiring pattern 23 of the planar conductive film 10 or 11.

In this way, the method for evaluating and determining the planar wiring pattern of the conductive film according to the invention ends. Therefore, it is possible to evaluate and manufacture the planar conductive film according to the invention having the planar wiring pattern obtained by expanding, in a planar shape, the conductive film with a three-dimensional shape according to the invention having an optimized projection wiring pattern which can prevent the occurrence of moire even when it is superimposed on the BM pattern of the display unit of the display device and improve the visibility of moire for display devices with different resolutions, regardless of the observation distance.

When the conductive film with a three-dimensional shape according to the invention is formed, the method for evaluating and determining the projection wiring pattern of the conductive film according to the invention may end in Step S24.

The above-mentioned example is based on the technique disclosed in JP2013-020775 applied by the inventors. In the technique, in Process 4, the human standard visual response characteristics corresponding to the observation distance are applied to the frequency and intensity of moire to calculate the moire evaluation index and the evaluation of the wiring pattern and the evaluation and determination of the optimized wiring pattern are performed on the basis of the evaluation index. However, the invention is not limited thereto. Instead of Process 4, the following Process 4a may be performed which applies the human standard visual response characteristics to the frequency and intensity of moire, with a fixed observation distance, on the basis of the technique disclosed in JP2012-082711 applied by the inventors, to calculate the moire evaluation index and performs the evaluation of the wiring pattern and the evaluation and determination of the optimized wiring pattern on the basis of the evaluation index.

Figure 19:
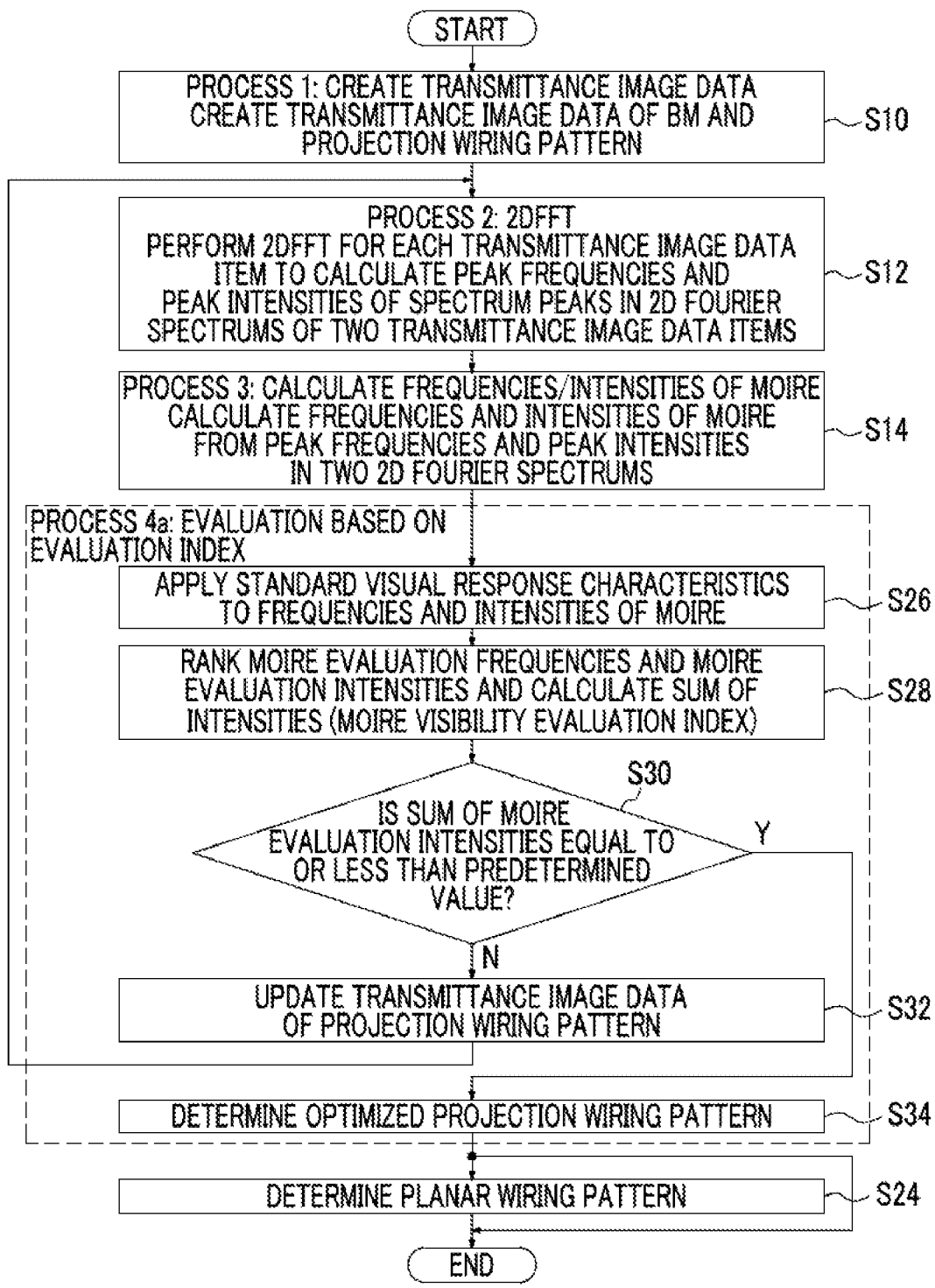
FIG. 19 is a flowchart illustrating another example of the method for evaluating and determining the projection wiring pattern of the conductive film according to the invention.

FIG. 19 is a flowchart illustrating another example of the method for evaluating and determining the projection wiring pattern of the conductive film according to the invention.

The method for evaluating and determining the projection wiring pattern illustrated in FIG. 19 is substantially the same as the method for evaluating and determining the projection wiring pattern illustrated in FIG. 11 in Processes 1 to 3. Therefore, the detailed description thereof will not be repeated and only the difference therebetween will be mainly described.

In this example, Processes 1 (Step S10) to 3 (Step S14) are the same as those in the example illustrated in FIG. 11.

In this example, in Step S10 of Process 1, in the wiring pattern 62 of the conductive film 60, for example, the thin metal wires 14 which are wiring lines may form a square lattice which is inclined at an angle of 45° [deg].

Here, it is assumed that the size of the transmittance image data of the BM pattern 38 and the wiring pattern 62 is defined to be, for example, 4096 (pixels)×4096 (pixels). In addition, for example, a flipping process may be performed for the images of the BM pattern 38 and the wiring pattern 62 in all directions (eight directions) in order to prevent or reduce period artifacts during an FFT process in Process 2, which will be described below. A new image after the flipping process may be an image with a size (the size of one side: 8192 (pixels)=4096 (pixels)×2) in a region corresponds to four images.

In Step S12 of Process 2, when the intensity of a spectrum peak at a peak position is acquired, the average value of the spectrum intensities of a plurality of pixels, which are ranked in descending order of spectrum intensity, in a region including a plurality of pixels in the vicinity of the peak position, for example, five pixels, which are ranked in descending order of spectrum intensity, in a region including 5×5 pixels is preferably used as the peak intensity (absolute value).

Then, as Process 4a, evaluation is performed on the basis of the moire evaluation index and a visibility limit value is determined.

Figure 20:
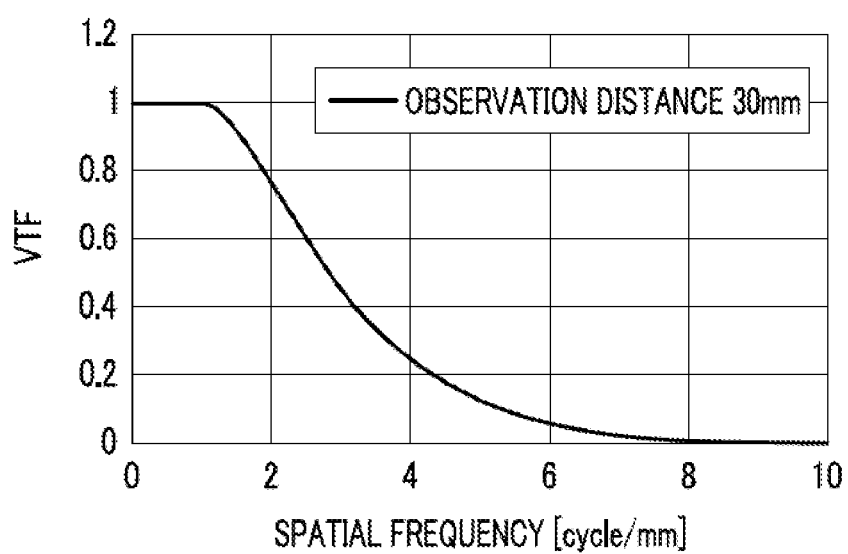
FIG. 20 is a graph illustrating an example of the human standard visual response characteristics.

Specifically, first, as illustrated in FIG. 19, in Step S26, the human standard visual response characteristics illustrated in FIG. 20 are applied to, that is, multiplied by the frequency and intensity (absolute value) of moire obtained in Step S14 to calculate a moire evaluation frequency and moire evaluation intensity (absolute value). That is, the obtained frequency and intensity of moire are convolved with a visual transfer function (VTF) illustrated in FIG. 20 which indicates an example of the human standard visual response characteristics. The visual transfer function has the Dooley-Shaw function as a basis and is used to remove the attenuation of the sensitivity to low-frequency components.

In this embodiment, the Dooley-Shaw function at an observation distance of 300 mm under clear vision conditions is used as the human standard visual response characteristics. The Dooley-Shaw function is a kind of visual transfer function (VTF) and is a representative function which simulates the human standard visual response characteristics. Specifically, the Dooley-Shaw function corresponds to the square of brightness/contrast ratio characteristics. The horizontal axis of the graph indicates a spatial frequency (unit: cycles/mm) and the vertical axis indicates a VTF value (unit: no dimension).

When the observation distance is 300 mm, the VTF value is constant (equal to 1) in a range of 0 cycle/mm to 1.0 cycles/mm and the VTF value tends to decrease as the spatial frequency increases. That is, this function functions as a low-pass filter that cuts off mid-to-high spatial frequency bands.

The actual human visual response characteristics have a value smaller than 1 in the vicinity of 0 cycle/mm and are so-called band-pass filter characteristics. However, in this embodiment, the VTF value is set to 1 even in a very low spatial frequency band to remove the attenuation of the sensitivity to low-frequency components, as illustrated in FIG. 20. Therefore, it is possible to suppress periodicity caused by the repeated arrangement of the wiring pattern 62.

Then, as illustrated in FIG. 19, in Step S28, for the evaluation frequencies and evaluation intensities (absolute values) of moire obtained in Step S26, the sum of the evaluation intensities (absolute values) of moire having a moire evaluation frequency which falls within a predetermined frequency range determined by the standard visual response characteristics is calculated as a moire visibility evaluation index according to the invention. That is, convolution with the VTF is performed and the evaluation frequencies and evaluation intensities of moire are ranked for optimization. Here, for matching with visual sensitivity, after the convolution with the VTF (Step S28), conversion into density is performed and the common logarithm is applied to the evaluation intensities. Further, in order to efficiently rank the visibility of moire, the following conditions are empirically set. That is, the density of moire is used as the evaluation intensity of moire at that time.

The following patterns are ranked.

1. The ranking is performed using only data in which the evaluation spatial frequency of moire is equal to or less than 3 cycles/mm.

2. A pattern in which the evaluation intensity of moire is equal to or greater than −5 at an evaluation spatial frequency of 1.8 cycles/mm or less is not ranked.

3. A pattern in which the evaluation intensity of moire is equal to or greater than −3.7 at an evaluation spatial frequency of 1.8 cycles/mm to 3 cycles/mm is not ranked.

Under these conditions, it is preferable to minimize the sum of the evaluation intensities of moire and the wiring pattern 62 in which the common logarithm of the sum of the evaluation intensities of moire is equal to or less than 0 (the antilogarithm of the sum is equal to or less than 1) is set as the optimized wiring pattern 24 according to the present invention. When a plurality of optimized wiring patterns 24 are obtained, the wiring pattern with the smallest sum of the evaluation intensities of moire is determined to be the best wiring pattern 24 and the plurality of optimized wiring patterns 24 are ranked.

In addition, the sum of the evaluation intensities of moire was calculated for simulation samples and actual samples of a plurality of wiring patterns 62 and three researchers evaluated the wiring patterns 62 and the sums of the evaluation intensities of moire. As a result, when the common logarithm of the sum of the evaluation intensities of moire was equal to or less than −4 (the antilogarithm of the sum was equal to or less than $10^{-4}$), moire was not seen at all in sensory evaluation and the evaluation result was excellent (++). When the common logarithm of the sum of the evaluation intensities of moire was greater than −4 and equal to or less than −2.5 (the antilogarithm of the sum was greater than $10^{-4}$ and equal to or less than $10^{-2.5}$), moire was hardly seen in sensory evaluation and the evaluation result was good (+). When the common logarithm of the sum of the evaluation intensities of moire was greater than −2.5 and equal to or less than 0 (the antilogarithm of the sum was greater than $10^{-2.5}$ and equal to or less than 1), moire was seen slightly in sensory evaluation, but did not cause discomfort and the evaluation result was fair (+−). When the common logarithm of the sum of the evaluation intensities of moire was greater than 0 (the antilogarithm of the sum was greater than 1), moire was seen in sensory evaluation and the evaluation result was poor (unusable).

Therefore, in the invention, the common logarithm of the sum of the evaluation intensities of moire which is the moire visibility evaluation index is limited to 0 or less (the antilogarithm of the sum is limited to 1 or less).

Then, as illustrated in FIG. 19, in Step S30, the sum of the evaluation intensities of moire calculated in Step S28 is compared with a predetermined value and it is determined whether the sum of the evaluation intensities of moire is equal to or less than the predetermined value, for example, 0.

When it is determined that the sum of the evaluation intensities of moire is greater than the predetermined value, the process proceeds to Step S32 and the transmittance image data of the wiring pattern 62 is updated to the transmittance image data of a new wiring pattern. Then, the process returns to Step S12.

Here, the updated new wiring pattern may be provided in advance or may be newly created. When the wiring pattern is newly created, one or more of the rotation angle, the pitch, and the pattern width in the transmittance image data of the wiring pattern may be changed or the shape or the size of the opening in the wiring pattern may be changed. In addition, these factors may be arbitrary.

Thereafter, the calculation of the peak frequencies and the peak intensities in Step S12, the calculation of the frequency and intensity of moire in Step S14, the calculation of the evaluation frequencies and evaluation intensities of moire in Step S26, the calculation of the sum of the evaluation intensities of moire in Step S28, the comparison of the sum of the evaluation intensities of moire with the predetermined value in Step S30, and the update of the transmittance image data of the wiring pattern in Step S32 are repeatedly performed until the sum of the evaluation intensities of moire is equal to or less than the predetermined value.

On the other hand, when it is determined that the evaluation index which is the sum of the evaluation intensities of moire is equal to or less than the predetermined value, the process proceeds to Step S34 and the wiring pattern 62 is evaluated and determined to be the optimized wiring pattern and is set as the projection wiring pattern 24 of the conductive film 10 or 11 with a three-dimensional shape according to the invention.

Then, in Step S24, the set projection wiring pattern 24 is expanded in a planar shape to determine the planar wiring pattern 23 of the planar conductive film 10.

In this way, the method for evaluating and determining the planar wiring pattern of the conductive film according to the invention ends. Therefore, it is possible to manufacture the planar conductive film according to the invention having the planar wiring pattern obtained by expanding, in a planar shape, the conductive film with a three-dimensional shape according to the invention having an optimized projection wiring pattern which can prevent the occurrence of moire even when it is superimposed on the BM pattern of the display unit of the display device and improve the visibility of moire.

When the conductive film with a three-dimensional shape according to the invention is formed, the method for evaluating and determining the projection wiring pattern of the conductive film according to the invention may end in Step S24.

However, in the conductive film with a three-dimensional shape according to the invention which has the projection wiring pattern optimized for the visibility of moire of the conductive film superimposed on the BM pattern of the display unit and/or the graininess of the conductive film superimposed on the display surface of the display unit, that is, the visibility of so-called surface roughness, the density of the wiring mesh of the projection wiring pattern (particularly, rhombic openings or random openings) is uniform.

In the conductive film according to the invention having the optimized projection wiring pattern which is determined by the method for evaluating and determining the projection wiring pattern of the conductive film according to the invention, as such, it is preferable that the density of the wiring mesh of the projection wiring pattern (particularly, rhombic openings or random openings) is uniform.

Specifically, in the optimized projection wiring pattern, when the average of the opening areas of the openings is 1.0, a variation in the opening area is preferably equal to or less than 20% of the average, that is, in the range of 0.8 to 1.2.

That is, the uniformity of the density of the wiring mesh of the wiring pattern, specifically, a variation in the opening area of the opening in the wiring mesh can be used as an example of the index for evaluating the visibility of moire and/or graininess.

Here, the following methods can be used as a method for specifying the uniformity of the density of the wiring mesh in the wiring pattern of the conductive film (product).

First, in a first method, the image of the conductive film is captured to acquire a wiring pattern image (transmittance image data), with the conductive film as a product being actually attached in a three-dimensional shape to the display surface of the display unit.

For example, first, light is incident on the conductive film (product), with the display turned off. Then, light reflected from the wires is received by a digital camera from a given observation point and the image of the wires is captured. In this way, the wiring pattern image is acquired when the conductive film (product) is observed from a given point of view.

At that time, when the observation surface is wide, the camera may be moved onto a plane parallel to the observation surface, capture images at a plurality of positions, synthesize partial images into a panorama image, and generate the wire image.

Then, in a second method, a wiring pattern image (transmittance image data) is acquired from a three-dimensional model of the conductive film (product) with a three-dimensional shape by a simulation.

In this method, first, the three-dimensional shape and planar wiring pattern of the conductive film (product) product are converted into data.

For example, the image of the three-dimensional shape of the conductive film (a product or a three-dimensional model) is captured by a three-dimensional shape measurement camera and the three-dimensional shape is converted into data to obtain three-dimensional shape data. In addition, the image of the wiring pattern with a two-dimensional (planar) shape is captured by, for example, a film scanner and the planar wiring pattern is converted into data to obtain planar wiring pattern data.

The conductive film (product) with a three-dimensional shape is reproduced as a three-dimensional model in a simulation space of a computer, such as a personal computer, on the basis of the obtained three-dimensional shape data and planar wiring pattern data.

A wiring pattern image when the three-dimensional model of the reproduced conductive film (product) is observed from a given observation point is acquired by projection. In this way, the wiring pattern image is acquired by a simulation.

Finally, in the first method or the second method, it is determined whether the density of the wires is uniform from the acquired wiring pattern image, that is, whether the density of the wiring mesh of the wiring pattern is uniform, specifically, whether a variation in the opening area of the opening in the wiring mesh is equal to or less than 20%.

In the optimized projection wiring pattern according to the invention, the reason why a variation in the opening area of the opening in the wiring mesh is limited to 20% or less, that is, the range of 0.8 to 1.2 will be described below.

Figure 21:
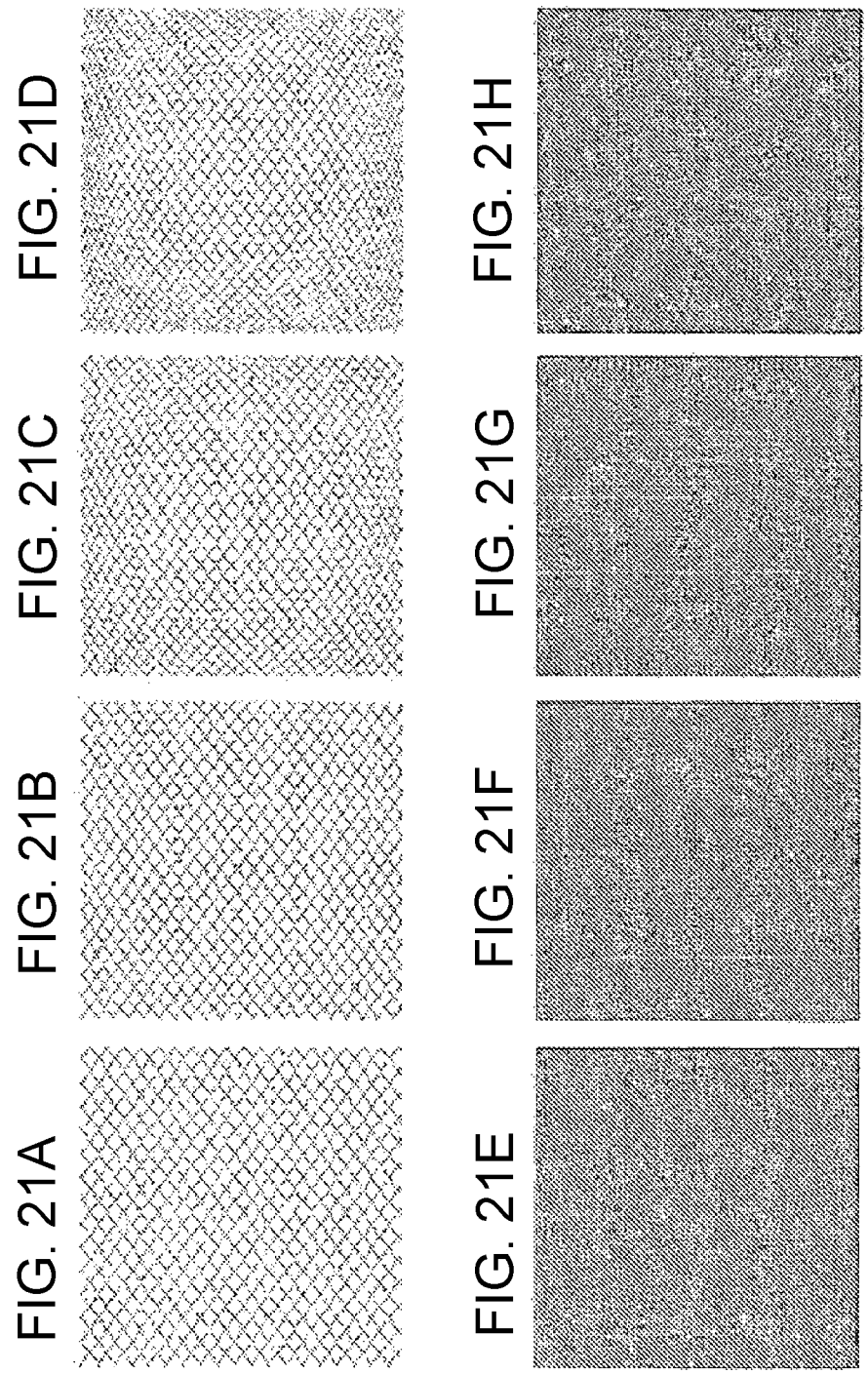
FIGS. 21A, 21B, 21C, and 21D are diagrams illustrating the projection wiring patterns of the conductive films with a three-dimensional shape in a usage state in which the average values of the opening areas are different
FIGS. 21E, 21F, 21G, and 21H are diagrams schematically illustrating moire which is seen from the conductive films having the projection wiring patterns illustrated in FIGS. 21A, 21B, 21C, and 21D, respectively.

FIG. 21A illustrates the projection wiring pattern according to the invention in which the average of the opening areas of the openings in a rhombus pattern is 1.0 and a variation in the opening area of the opening is 0%. As illustrated in FIG. 21E, in the projection wiring pattern according to the invention, moire is not seen even when the projection wiring pattern is superimposed on the BM pattern of the display unit and the visibility of moire is high.

The BM pattern used here has a square shape in which a pixel pitch (Pv, Ph) is, for example, 114 μm and three R, G, and B sub-pixels with a rectangular shape each have a size of, for example, 30 μm (length in the horizontal direction)× 88 μm (length in the vertical direction).

The wiring pattern has, for example, a rhombic shape in which an angle is 36° and a pitch is 226 μm.

In contrast, FIGS. 21B, 21C, and 21D illustrate projection wiring patterns in which variations in the opening area of an opening in a wiring mesh is 25%, 50%, and 75%, respectively. As illustrated in FIGS. 21F, 21G, and 21H, when these projection wiring patterns are superimposed on the BM pattern of the same display unit, moire is seen.

FIGS. 21B, 21C, and 21D illustrate the projection wiring patterns obtained by simulations, assuming a three-dimensional shape obtained by gradually increasing the curvature of curves in the three-dimensional shape in which a portion of the conductive film illustrated in FIG. 3 is curved with a predetermined curvature in the rhombus pattern illustrated in FIG. 21A. FIGS. 21F, 21G, and 21H illustrate moire images corresponding to FIGS. 21B, 21C, and 21D, respectively.

Therefore, it is preferable that the variation in the opening area is equal to or less than 20%, that is, in the range of 0.8 to 1.2.

In the invention, the conductive film may be a planar conductive film having a planar wiring pattern which is obtained by expanding the projection wiring pattern optimized for a three-dimensional shape in a two-dimensional shape, that is, a planar shape.

In the invention, the sum of the moire evaluation values (intensities) considering the observation distance or the sum of the moire evaluation intensities is used as the moire visibility evaluation index and the variation in the opening area of the opening in the wiring mesh is used as the index for evaluating the visibility of moire and/or graininess (noise granular feeling and color noise). However, the invention is not limited thereto. Any evaluation index may be used as long as it can evaluate the visibility of moire and/or graininess in the projection wiring pattern.

For example, for the power spectrum of the two-dimensional distribution of the position of the center of gravity of the mesh shape of the mesh pattern (projection wiring pattern) described in JP2011-221432 applied by the inventors, the ratio of average intensity at a spatial frequency higher than a predetermined spatial frequency to average intensity in a spatial frequency band lower than the predetermined spatial frequency may be used as the graininess (noise granular feeling) visibility evaluation index and a predetermined range may be greater than 1.0. That is, the optimized mesh pattern may be configured such that average intensity at a high spatial frequency is higher than average intensity in a low spatial frequency band. In addition, for example, the predetermined spatial frequency is preferably a spatial frequency at which the human visual response characteristics are 5% of the maximum response, more preferably 6 cycles/mm which is a spatial frequency when the human visual response characteristics are visual response characteristics obtained on the basis of the Dooley-Shaw function at a visibility distance of 300 mm, and most preferably a spatial frequency at which the value of the power spectrum is the maximum. Here, for the two-dimensional distribution of the position of the center of gravity, the mean square deviation of the positions of the centers of gravity which are arranged in a predetermined direction from the positions of the centers of gravity arranged in a direction perpendicular to the predetermined direction is preferably equal to or greater than 15 μm and equal to or less than 65 μm.

In addition, the graininess (noise granular feeling and color noise) visibility evaluation index may be the standard deviation of the opening area of the opening in the mesh shape of the mesh pattern (projection wiring pattern) described in JP2012-166946 applied by the inventors and the predetermined range may be from 0.017 mm$^2$ to 0.038 mm$^2$ and preferably from 0.019 mm$^2$ to 0.027 mm$^2$. For the two-dimensional distribution of the positions of the centers of gravity of the openings in the mesh shape of the mesh pattern, the evaluation index may be the standard deviation of the mean square deviation of the positions of the centers of gravity which are arranged in a predetermined direction from the positions of the centers of gravity arranged in a direction perpendicular to the predetermined direction and the predetermined range may be equal to or greater than 15.0 μm and preferably equal to or greater than 54.62 μm. In addition, for a standard deviation along an angular direction in the power spectrum of the mesh pattern, the standard deviation of the common logarithm deviation in a diametrical direction may be used as the evaluation index and the predetermined range may be from 0.965 to 1.065 and preferably from 0.97 to 1.06. These evaluation indexes may be used as individual evaluation indexes or a combination of some or all of the evaluation indexes may be used as a comprehensive evaluation index.

Furthermore, for the rhombic shape of the rhombic wiring pattern in which the sum of moire visibility evaluation intensities (the above-mentioned moire visibility evaluation indexes) obtained by applying the human visual response characteristics to the frequency and intensity of moire, which are obtained by two-dimensional Fourier spectrum analysis for the BM pattern of the display unit and the mesh pattern (projection wiring pattern) described in JP2012-082706 applied by the inventors, according to the observation distance is equal to or less than a predetermined value, irregularity in a predetermined range which is determined according to the width of the thin metal wire may be used as a new moire evaluation index. The predetermined range may be from 2% to 20% when the width of the thin metal wire is equal to or less than 3 μm and may be from 2% to 10% when the width of the thin metal wire is greater than 3 μm. At that time, when the direction in which the irregularity is given to the rhombic shape is a direction parallel or perpendicular to a side of a rhombus, the irregularity is defined as the ratio of the average value according to a normal distribution for the pitch of the rhombus after the irregularity is given to the pitch of the rhombus before the irregularity is given.

In the invention, the conductive film has a mesh-shaped wiring pattern (projection wiring pattern) formed by continuous thin metal wires. However, the invention is not limited thereto. As described above, any conductive film may be used as long as it satisfies the evaluation standards according to the invention. For example, a conductive film may be used which has a mesh-shaped wiring pattern in which a thin metal wire has a break, like the pattern shape of the mesh-shaped wiring pattern of the conductive film described in JP2012-276175 applied by the inventors. That is, the evaluation index may be the visibility of moire with the lowest frequency spectrum intensity which is represented by the convolution between the spatial frequency characteristics of the pixel array pattern of the display unit and the spatial frequency characteristics of the mesh pattern when the pattern is observed from at least the front side, which is described in JP2012-276175. The common logarithm of the predetermined range may be equal to or less than −3.6.

The mesh-shaped wires of the conductive film include an electrode portion having a mesh-shaped electrode wiring pattern which is formed by a plurality of thin metal wires so as to be continuous and a non-electrode portion that is insulated from the electrode portion and has a non-electrode wiring pattern which is formed in a mesh shape by a plurality of thin metal wires, has a plurality of break portions, and is not continuous. The mesh pattern of the mesh-shaped wires includes the electrode wiring pattern of the electrode portion and the non-electrode wiring pattern of the non-electrode portion which is insulated from the electrode wiring pattern. The spatial frequency characteristics of the mesh pattern are preferably the spatial frequency characteristics of the mesh pattern including a plurality of break portions when the pattern is observed from at least the front side.

It is assumed that the lowest frequency among the spatial frequencies of moire which are obtained by the convolution between the spatial frequency characteristics of the pixel array pattern of the display unit and the spatial frequency characteristics of the wiring pattern (projection wiring pattern) described in JP2012-082706 applied by the inventors is a first lowest frequency fm1 and the lowest frequency among the spatial frequencies of moire which are obtained by the convolution between the spatial frequency characteristics of half of the wiring pattern and the spatial frequency characteristics of the pixel array pattern of the display unit is a second lowest frequency fm2. In this case, the ratio fm1/fm2 of fm1 to fm2 may be used as the moire visibility evaluation index and the predetermined range may be equal to or less than 1.0. That is, the wiring pattern in which the first lowest frequency fm1 is equal to or less than the second lowest frequency fm2 may be selected as the optimized projection wiring pattern.

Furthermore, in the invention, the moire and/or graininess (noise granular feeling and color noise) visibility evaluation index to which the techniques according to the related art including, for example, the techniques disclosed in Cited Documents 3 to 5 are applied and the range of the index may be used in order to obtain the optimized projection wiring pattern.

In the example of the conductive film 11 according to the invention illustrated in FIG. 8, only the second conductive portion 16b is formed in the conductive layer 28b. However, the invention is not limited thereto. Similarly to the conductive layer 28a, a dummy electrode portion 26 which is electrically insulated from the second conductive portion 16b may be provided at a position corresponding to a plurality of thin metal wires 14 of the first conductive portion 16a, as in a conductive film 11A illustrated in FIG. 22. In this case, the planar wiring pattern 23 of the conductive layer 28a can be the same as the planar wiring pattern 23 of the conductive layer 28b and it is possible to further improve the visibility of an electrode.

Figure 22:
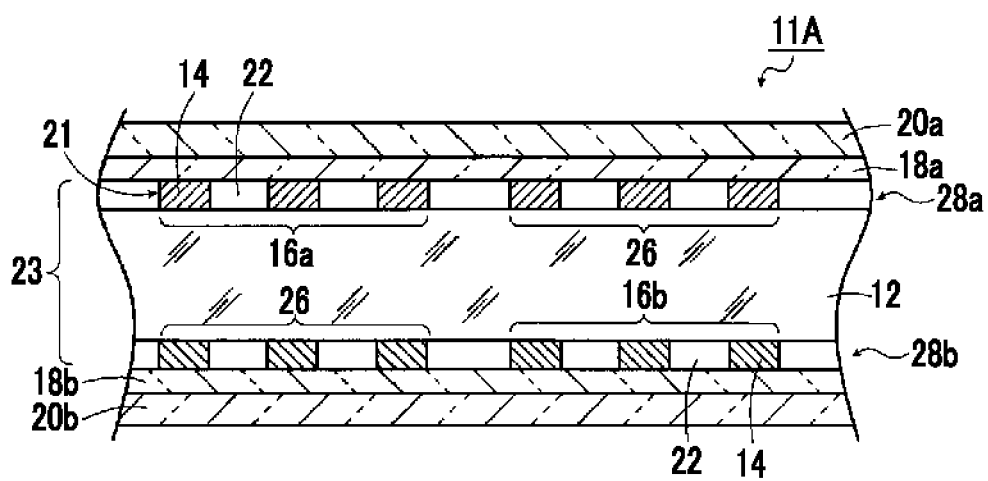
FIG. 22 is a partial cross-sectional view schematically illustrating an example of a conductive film according to another embodiment of the invention.

In the example illustrated in FIG. 22, the conductive layer 28a and the conductive layer 28b have the same planar wiring pattern 23 and are superimposed on each other without any deviation to form one planar wiring pattern 23. However, the projection wiring patterns of the conductive layer 28a and the conductive layer 28b may be superimposed so as to deviate from each other as long as they satisfy the evaluation standards of the invention or the conductive layer 28a and the conductive layer 28b may have different wiring patterns.

Various embodiments and examples of the conductive film, the display device including the conductive film, and the method for evaluating and determining the wiring pattern of the conductive film according to the invention have been described above. However, the invention is not limited to the above-described embodiments and examples. Various modifications of the invention may be made or the design may be changed, without departing from the scope and spirit of the invention.

What is claimed is:

1. A conductive film which is provided on a display unit of a display device and is used with at least a portion being curved with a predetermined curvature, the conductive film comprising:
    a transparent base; and
    a conductive portion that is formed on at least one surface of the transparent base and includes a plurality of thin metal wires,
    wherein the conductive portion has a wiring pattern which is formed in a mesh shape by the plurality of thin metal wires and in which a plurality of openings are arranged,
    the wiring pattern is superimposed on a pixel array pattern of the display unit, and
    an index for evaluating moire which occurs due to interference between the pixel array pattern and a projection wiring pattern obtained by projecting the wiring pattern of the conductive film, which is expanded in a planar shape, in a three-dimensional shape in which the at least portion is curved with the predetermined curvature in a usage state of the conductive film, as viewed from at least one point of view, is within a predetermined range in which the moire is not seen.

2. The conductive film according to claim 1,
    wherein the conductive film has a three-dimensional shape having curved portions which are curved with the predetermined curvature and are provided on both corresponding sides of a display surface of the display unit and a planar portion which is provided between the two curved portions and is parallel to the display surface of the display unit in the usage state, and
    the one point of view is in front of the conductive film in a direction perpendicular to the planar portion parallel to the display surface of the display unit.

3. The conductive film according to claim 1,
    wherein the conductive film is a planar conductive film having a planar wiring pattern obtained by expanding the projection wiring pattern, which is projected in the three-dimensional shape in the usage state, in a planar shape.

4. The conductive film according to claim 1,
    wherein the moire evaluation index is calculated from a moire evaluation value obtained by applying, depending on an observation distance, human visual response characteristics to intensities of moire at each frequency of the moire equal to or lower than the highest frequency of the moire, which is defined according to a display resolution of the display unit, among the frequencies and intensities of the moire which are calculated from peak frequencies and peak intensities of a plurality of spectrum peaks in a two-dimensional Fourier spectrum of transmittance image data of the projection wiring pattern and peak frequencies and peak intensities of a plurality of spectrum peaks in a two-dimensional Fourier spectrum of transmittance image data of the pixel array pattern, as viewed from at least one point of view, and the predetermined range is equal to or less than a predetermined value.

5. The conductive film according to claim 4,
wherein the common logarithm of the predetermined value is −1.75, and
the common logarithm of the moire evaluation index is equal to or less than −1.75.

6. The conductive film according to claim 4,
wherein the moire evaluation index is calculated by weighting through convolution between the frequencies and intensities of the moire and a visual transfer function which indicates the visual response characteristics and corresponds to the observation distance.

7. The conductive film according to claim 1,
wherein the projection wiring pattern has uniform mesh density.

8. The conductive film according to claim 1,
wherein the projection wiring pattern is a rhombus pattern or a random pattern.

9. The conductive film according to claim 1,
wherein, when the average of the opening areas of the openings in the projection wiring pattern is 1.0, a variation in the opening area in the projection wiring pattern is in a range of 0.8 to 1.2.

10. A conductive film which is provided on a display unit of a display device and is used with at least a portion being curved with a predetermined curvature, the conductive film comprising:
a transparent base; and
a conductive portion that is formed on at least one surface of the transparent base and includes a plurality of thin metal wires,
wherein the conductive portion has a wiring pattern which is formed in a mesh shape by the plurality of thin metal wires and in which a plurality of openings are arranged, and
a projection wiring pattern obtained by projecting the wiring pattern of the conductive film, which is expanded in a planar shape, in a three-dimensional shape in which the at least portion is curved with the predetermined curvature in a usage state of the conductive film has uniform mesh density, as viewed from at least one point of view.

11. The conductive film according to claim 1,
wherein the projection wiring pattern is a rhombus pattern or a random pattern.

12. The conductive film according to claim 1,
wherein, when the average of the opening areas of the openings in the projection wiring pattern is 1.0, a variation in the opening area in the projection wiring pattern is in a range of 0.8 to 1.2.

13. A display device comprising:
a display unit; and
the conductive film according to claim 1 that is provided on a display surface of the display unit, with at least a portion being curved with the predetermined curvature.

14. A display device comprising:
a display unit; and
the conductive film according to claim 10 that is provided on a display surface of the display unit, with at least a portion being curved with the predetermined curvature.

15. A method for evaluating and determining a wiring pattern of a planar conductive film that is provided on a display unit of a display device, has the wiring pattern which is formed in a mesh shape by a plurality of thin metal wires and in which a plurality of openings are arranged, and is used with at least a portion being curved with a predetermined curvature, the method comprising:
projecting the wiring pattern of the planar conductive film to a usage state of the conductive film in which the at least portion is curved with the predetermined curvature to obtain a projection wiring pattern;
superimposing the obtained projection wiring pattern on a pixel array pattern of the display unit;
calculating an index for evaluating moire which occurs due to interference between the projection wiring pattern and the pixel array pattern, as viewed from at least one point of view;
comparing the calculated moire evaluation index with a predetermined range in which the moire is not seen and evaluating and calculating a projection wiring pattern in which the moire evaluation index is within the predetermined range; and
expanding the calculated projection wiring pattern in a planar shape to determine the wiring pattern of the planar conductive film.

16. The method for evaluating and determining a wiring pattern of a planar conductive film according to claim 15,
wherein the moire evaluation index is calculated from a plurality of moire evaluation values,
the plurality of moire evaluation values are obtained by:
acquiring transmittance image data of the projection wiring pattern and transmittance image data of a pixel array pattern of the display unit on which the projection wiring pattern is superimposed, as viewed from at least one point of view;
performing two-dimensional Fourier transform for the transmittance image data of the projection wiring pattern and the transmittance image data of the pixel array pattern to calculate peak frequencies and peak intensities of a plurality of spectrum peaks in a two-dimensional Fourier spectrum of the transmittance image data of the projection wiring pattern and peak frequencies and peak intensities of a plurality of spectrum peaks in a two-dimensional Fourier spectrum of the transmittance image data of the pixel array pattern;
calculating frequencies and intensities of moire from the calculated peak frequencies and peak intensities of the projection wiring pattern and the calculated peak frequencies and peak intensities of the pixel array pattern;
selecting moire having frequencies equal to or lower than the highest frequency of the moire which is defined according to a display resolution of the display unit from the calculated frequencies and intensities of the moire; and
applying human visual response characteristics to the intensities of the moire at each frequency of the selected moire, depending on an observation distance, and
the common logarithm of the predetermined range is −1.75.

17. The method for evaluating and determining a wiring pattern of a planar conductive film according to claim 16, wherein a difference between the peak frequency of the projection wiring pattern and the peak frequency of the pixel array pattern is calculated as the frequency of the moire, and the product of two sets of vector intensities of the peak intensities of the projection wiring pattern and the peak intensities of the pixel array pattern is calculated as the intensity of the moire.

\* \* \* \* \*